(12) United States Patent
Rinderer et al.

(10) Patent No.: US 7,778,513 B2
(45) Date of Patent: Aug. 17, 2010

(54) CABLE MANAGER WITH ADJUSTABLE CABLE GUIDES

(75) Inventors: Eric R. Rinderer, Nashville, TN (US); Bruce Neace, Mascoutah, IL (US)

(73) Assignee: Cooper Technologies Company, Houston, TX (US)

( * ) Notice: Subject to any disclaimer, the term of this patent is extended or adjusted under 35 U.S.C. 154(b) by 231 days.

(21) Appl. No.: 12/017,876

(22) Filed: Jan. 22, 2008

(65) Prior Publication Data

US 2008/0130262 A1   Jun. 5, 2008

Related U.S. Application Data

(62) Division of application No. 11/333,063, filed on Jan. 17, 2006, now Pat. No. 7,362,941.

(60) Provisional application No. 60/645,803, filed on Jan. 21, 2005.

(51) Int. Cl.
G02B 6/00 (2006.01)
(52) U.S. Cl. ....................................... 385/134
(58) Field of Classification Search ................. 439/501; 385/134; 211/26; 174/50; 361/826
See application file for complete search history.

(56) References Cited

U.S. PATENT DOCUMENTS

| | | |
|---|---|---|
| 555,583 A | 3/1896 | Pletcher |
| 2,140,376 A | 6/1921 | Reed |
| 1,381,335 A | 7/1921 | Lachman |
| 2,434,918 A | 1/1948 | Gall |
| 2,531,110 A | 11/1950 | Cisler |
| 2,817,870 A | 12/1957 | Howell |
| 2,848,826 A | 8/1958 | Heble |
| 2,896,009 A | 7/1959 | Caveney |
| 2,921,607 A | 1/1960 | Caveney |
| 3,008,177 A | 11/1961 | Wooten |
| 3,024,301 A | 3/1962 | Walch |
| 3,126,444 A | 3/1964 | Taylor |
| 3,156,765 A | 11/1964 | Weiss |
| 3,229,029 A | 1/1966 | Weiss |
| 3,243,503 A | 3/1966 | Burley |
| 3,363,050 A | 1/1968 | Martin |
| 3,485,937 A | 12/1969 | Caveney |
| 3,488,795 A | 1/1970 | Marguelisch |
| 3,554,236 A | 1/1971 | Rhodes |
| 3,705,949 A | 12/1972 | Weiss |
| 3,755,716 A | 8/1973 | Yoshii et al. |
| 3,761,603 A | 9/1973 | Hays et al. |
| 3,809,799 A | 5/1974 | Taylor |
| 3,890,459 A | 6/1975 | Caveney |
| 3,906,146 A | 9/1975 | Taylor |
| 3,910,536 A | 10/1975 | Sharp et al. |
| 3,917,202 A | 11/1975 | Reinwall, Jr. et al. |
| 3,966,074 A | 6/1976 | Hotchkiss et al. |
| 3,968,322 A | 7/1976 | Taylor |
| 4,002,856 A | 1/1977 | Sedlacek et al. |
| 4,037,910 A | 7/1977 | Paluch |
| 4,136,257 A | 1/1979 | Taylor |
| 4,278,315 A | 7/1981 | Osborne |

(Continued)

*Primary Examiner*—Chandrika Prasad
(74) *Attorney, Agent, or Firm*—Senniger Powers LLP

(57) ABSTRACT

A cable management system for routing cable with respect to electronic equipment. This system has a variety of improvements providing greater flexibility in routing cable to and from the equipment.

10 Claims, 23 Drawing Sheets

U.S. PATENT DOCUMENTS

| | | | |
|---|---|---|---|
| 4,484,020 A | 11/1984 | Loof et al. |
| 4,497,411 A | 2/1985 | DeBortoli |
| D282,538 S | 2/1986 | Loof et al. |
| 4,579,310 A | 4/1986 | Wells et al. |
| 4,613,174 A | 9/1986 | Berg et al. |
| 4,641,225 A | 2/1987 | Reichle |
| 4,641,754 A | 2/1987 | Hebel et al. |
| 4,665,546 A | 5/1987 | Brey et al. |
| 4,669,799 A | 6/1987 | Vachhani et al. |
| 4,679,123 A | 7/1987 | Young |
| 4,685,255 A | 8/1987 | Kelley |
| 4,747,020 A | 5/1988 | Brickley et al. |
| 4,753,606 A | 6/1988 | DeLuca et al. |
| 4,902,852 A | 2/1990 | Wuertz |
| 4,975,072 A | 12/1990 | Afshar |
| 5,004,192 A | 4/1991 | Handler |
| 5,023,404 A | 6/1991 | Hudson et al. |
| 5,035,645 A | 7/1991 | Siemon et al. |
| 5,038,539 A | 8/1991 | Kelley et al. |
| 5,058,347 A | 10/1991 | Schuelke et al. |
| 5,086,195 A | 2/1992 | Claisse |
| 5,089,667 A | 2/1992 | Goussin et al. |
| 5,115,377 A | 5/1992 | Dransman |
| 5,153,819 A | 10/1992 | Hebel |
| D331,916 S | 12/1992 | DuBrucq |
| 5,187,836 A | 2/1993 | Kim et al. |
| 5,255,161 A | 10/1993 | Knoll et al. |
| 5,277,006 A | 1/1994 | Ruster |
| 5,286,919 A | 2/1994 | Benson et al. |
| 5,307,243 A | 4/1994 | Sharp et al. |
| 5,312,270 A | 5/1994 | Sieman et al. |
| 5,326,934 A | 7/1994 | LeMaster et al. |
| 5,362,923 A | 11/1994 | Newhouse et al. |
| 5,383,318 A | 1/1995 | Kelley et al. |
| 5,391,084 A | 2/1995 | Kreitzman |
| 5,412,751 A | 5/1995 | Siemon et al. |
| D360,189 S | 7/1995 | Orlando |
| 5,511,349 A | 4/1996 | Kelley et al. |
| 5,542,549 A | 8/1996 | Siemon et al. |
| 5,586,012 A | 12/1996 | Lerman |
| 5,590,234 A | 12/1996 | Pulido |
| 5,597,980 A | 1/1997 | Weber |
| 5,615,850 A | 4/1997 | Cloninger |
| 5,640,482 A | 6/1997 | Barry et al. |
| D380,736 S | 7/1997 | Theis et al. |
| 5,660,120 A | 8/1997 | Sims |
| 5,673,632 A | 10/1997 | Sykes |
| 5,685,113 A | 11/1997 | Reuter et al. |
| D387,651 S | 12/1997 | Viklund |
| D387,652 S | 12/1997 | Carlson, Jr. |
| D388,400 S | 12/1997 | Rogers |
| 5,715,348 A | 2/1998 | Falkenberg et al. |
| D391,839 S | 3/1998 | Viklund et al. |
| 5,758,002 A | 5/1998 | Walters |
| 5,765,698 A | 6/1998 | Bullivant |
| 5,788,087 A | 8/1998 | Orlando |
| 5,804,765 A | 9/1998 | Siemon et al. |
| 5,806,687 A | 9/1998 | Ballesteros et al. |
| 5,806,811 A | 9/1998 | Viklund et al. |
| 5,825,635 A | 10/1998 | Mukoyama et al. |
| D404,364 S | 1/1999 | Viklund et al. |
| 5,867,372 A | 2/1999 | Shie |
| 5,902,961 A | 5/1999 | Viklund et al. |
| D411,735 S | 6/1999 | Bernard et al. |
| D411,950 S | 7/1999 | Dinh et al. |
| 5,918,837 A | 7/1999 | Vicain |
| 5,921,402 A | 7/1999 | Magenheimer |
| 5,921,795 A | 7/1999 | Weener et al. |
| 5,934,623 A | 8/1999 | Kopish |
| 5,942,729 A | 8/1999 | Carlson, Jr. et al. |
| 5,954,301 A | 9/1999 | Joseph et al. |
| 5,971,509 A | 10/1999 | Deimen et al. |
| 5,994,644 A | 11/1999 | Rindoks et al. |
| 5,997,117 A | 12/1999 | Krietzman |
| 6,000,769 A | 12/1999 | Chen |
| 6,003,273 A | 12/1999 | Elsholz et al. |
| 6,005,188 A | 12/1999 | Teichler et al. |
| 6,011,221 A | 1/2000 | Lecinski et al. |
| 6,012,683 A | 1/2000 | Howell |
| 6,014,490 A | 1/2000 | Canning et al. |
| 6,016,252 A | 1/2000 | Pignolet et al. |
| 6,067,233 A | 5/2000 | English et al. |
| 6,086,414 A | 7/2000 | Tipton et al. |
| 6,086,415 A | 7/2000 | Sanchez et al. |
| 6,102,214 A | 8/2000 | Mendoza |
| 6,127,631 A | 10/2000 | Green et al. |
| 6,129,316 A | 10/2000 | Bauer |
| 6,140,584 A | 10/2000 | Baldissara |
| 6,143,984 A | 11/2000 | Auteri |
| 6,170,784 B1 | 1/2001 | MacDonald et al. |
| 6,175,079 B1 | 1/2001 | Johnston et al. |
| 6,181,862 B1 | 1/2001 | Noble et al. |
| D437,206 S | 2/2001 | Dukes |
| D438,177 S | 2/2001 | Rogers |
| 6,185,098 B1 | 2/2001 | Benavides |
| D439,503 S | 3/2001 | Paliga et al. |
| D439,504 S | 3/2001 | Caveney |
| D440,210 S | 4/2001 | Larsen et al. |
| 6,215,069 B1 | 4/2001 | Martin et al. |
| 6,223,909 B1 | 5/2001 | Mendoza |
| 6,230,130 B1 | 5/2001 | Castello da Costa et al. |
| 6,245,998 B1 | 6/2001 | Curry et al. |
| 6,271,476 B1 | 8/2001 | Bobowick et al. |
| 6,285,565 B1 | 9/2001 | Aberg et al. |
| D448,737 S | 10/2001 | Nakamura |
| 6,318,680 B1 | 11/2001 | Benedict et al. |
| 6,321,917 B1 | 11/2001 | Mendoza |
| 6,322,176 B1 | 11/2001 | Wild |
| 6,332,594 B2 | 12/2001 | Shelton et al. |
| 6,347,714 B1 | 2/2002 | Fournier et al. |
| 6,349,837 B1 | 2/2002 | Serban |
| 6,355,880 B1 | 3/2002 | Bateson et al. |
| 6,362,430 B1 | 3/2002 | Brown et al. |
| 6,365,834 B1 | 4/2002 | Larson et al. |
| 6,370,246 B1 | 4/2002 | Daoud |
| 6,373,721 B2 | 4/2002 | Lecinski et al. |
| 6,380,484 B1 | 4/2002 | Theis et al. |
| 6,381,393 B1 | 4/2002 | Matthews et al. |
| 6,394,398 B1 | 5/2002 | Reed et al. |
| 6,396,989 B1 | 5/2002 | Johnston et al. |
| 6,398,149 B1 | 6/2002 | Hines et al. |
| 6,403,885 B1 | 6/2002 | Baker, III et al. |
| 6,410,844 B1 | 6/2002 | Bruner et al. |
| 6,427,952 B2 | 8/2002 | Caveney et al. |
| 6,427,953 B1 | 8/2002 | Dickens |
| 6,429,376 B1 | 8/2002 | Mendoza |
| 6,437,243 B1 | 8/2002 | VanderVelde et al. |
| D462,665 S | 9/2002 | Witting |
| D463,253 S | 9/2002 | Canty |
| D463,377 S | 9/2002 | Canty |
| 6,461,052 B1 | 10/2002 | Hines et al. |
| 6,463,728 B1 | 10/2002 | Daoud |
| 6,467,633 B1 | 10/2002 | Mendoza |
| 6,468,112 B1 | 10/2002 | Follingstad et al. |
| 6,489,565 B1 | 12/2002 | Krietzman et al. |
| 6,490,829 B1 | 12/2002 | Schreiner et al. |
| 6,494,411 B1 | 12/2002 | Bjorklund |
| 6,501,020 B2 | 12/2002 | Grant et al. |
| 6,501,899 B1 | 12/2002 | Marrs et al. |
| 6,504,094 B2 | 1/2003 | Woo et al. |
| 6,504,100 B2 | 1/2003 | Lawrence et al. |
| 6,504,987 B1 | 1/2003 | Macken et al. |
| 6,507,691 B1 | 1/2003 | Hunsinger et al. |
| 6,515,227 B1 | 2/2003 | Massey et al. |

| | | | | | |
|---|---|---|---|---|---|
| 6,540,312 B1 | 4/2003 | Lane | 2001/0002657 A1 | 6/2001 | Mendoza |
| 6,541,705 B1 | 4/2003 | McGrath | 2001/0022231 A1 | 9/2001 | Dyer |
| 6,543,626 B1 | 4/2003 | Mendoza | 2001/0030266 A1 | 10/2001 | MacDonald |
| 6,568,542 B1 | 5/2003 | Chen | 2001/0031124 A1 | 10/2001 | McGrath et al. |
| 6,584,267 B1 | 6/2003 | Caveney et al. | 2002/0039476 A1 | 4/2002 | Sauve et al. |
| 6,594,857 B2 | 7/2003 | Nhep et al. | 2002/0046862 A1 | 4/2002 | Woo et al. |
| 6,600,106 B2 | 7/2003 | Standish et al. | 2002/0074149 A1* | 6/2002 | Lawrence et al. ......... 174/72 A |
| 6,605,782 B1 | 8/2003 | Krietzman et al. | 2002/0129959 A1 | 9/2002 | Petersen |
| 6,613,981 B1 | 9/2003 | Hathcock et al. | 2002/0131750 A1 | 9/2002 | Holman et al. |
| 6,614,665 B2 | 9/2003 | Witty et al. | 2002/0136519 A1 | 9/2002 | Tinucci et al. |
| 6,614,978 B1 | 9/2003 | Caveney | 2002/0160631 A1 | 10/2002 | Mendoza |
| 6,614,981 B2 | 9/2003 | Zdinak et al. | 2002/0160660 A1 | 10/2002 | Mendoza |
| 6,621,714 B1 | 9/2003 | Li et al. | 2002/0170726 A1 | 11/2002 | Mendoza |
| 6,629,675 B1 | 10/2003 | Bjorklund et al. | 2002/0188943 A1 | 12/2002 | Freeman et al. |
| 6,631,875 B1 | 10/2003 | Kampf et al. | 2002/0197045 A1 | 12/2002 | Schmidt et al. |
| 6,647,197 B1 | 11/2003 | Marrs et al. | 2003/0008568 A1 | 1/2003 | Follingstad et al. |
| 6,677,533 B2 | 1/2004 | Bernard et al. | 2003/0022552 A1 | 1/2003 | Barker et al. |
| 6,686,541 B2 | 2/2004 | Chan | 2003/0037953 A1 | 2/2003 | Sarkinen et al. |
| 6,708,830 B2* | 3/2004 | Mendoza ................ 211/26 | 2003/0066936 A1 | 4/2003 | Beck et al. |
| 6,724,637 B2 | 4/2004 | Li et al. | 2003/0119385 A1 | 6/2003 | Elliot et al. |
| 6,734,354 B2 | 5/2004 | McClellan et al. | 2003/0185535 A1 | 10/2003 | Tinucci et al. |
| 6,742,746 B1 | 6/2004 | La Scola et al. | 2003/0188880 A1 | 10/2003 | McClellan et al. |
| 6,751,392 B1 | 6/2004 | Szilagyi et al. | 2003/0190036 A1 | 10/2003 | Mandoza |
| 6,766,093 B2 | 7/2004 | McGrath et al. | 2003/0228121 A1 | 12/2003 | Dwyer et al. |
| 6,766,095 B1 | 7/2004 | Bjorklund | 2004/0007372 A1 | 1/2004 | Krietzman et al. |
| 6,768,858 B2 | 7/2004 | Tinucci et al. | 2004/0026104 A1 | 2/2004 | Borbolla et al. |
| 6,785,459 B2 | 8/2004 | Schmidt et al. | 2004/0026105 A1* | 2/2004 | Mendoza .................. 174/50 |
| 6,796,437 B2 | 9/2004 | Krampotich et al. | 2004/0050808 A1 | 3/2004 | Krampotich et al. |
| 6,796,438 B2 | 9/2004 | Mendoza | 2004/0094491 A1* | 5/2004 | Smith et al. ................ 211/26 |
| 6,803,519 B2 | 10/2004 | de la Borbolla et al. | 2004/0149863 A1 | 8/2004 | Jelinger |
| 6,909,833 B2 | 6/2005 | Henschel et al. | 2004/0173545 A1* | 9/2004 | Canty et al. ................ 211/26 |
| 6,920,274 B2 | 7/2005 | Rapp et al. | 2004/0201975 A1 | 10/2004 | Bravo et al. |
| 7,142,765 B2 | 11/2006 | Rapp et al. | 2004/0206532 A1 | 10/2004 | McGrath et al. |
| 7,146,089 B2 | 12/2006 | Reagan et al. | 2006/0162948 A1* | 7/2006 | Rinderer et al. .............. 174/50 |
| 7,362,941 B2* | 4/2008 | Rinderer et al. ............ 385/134 | | | |

* cited by examiner

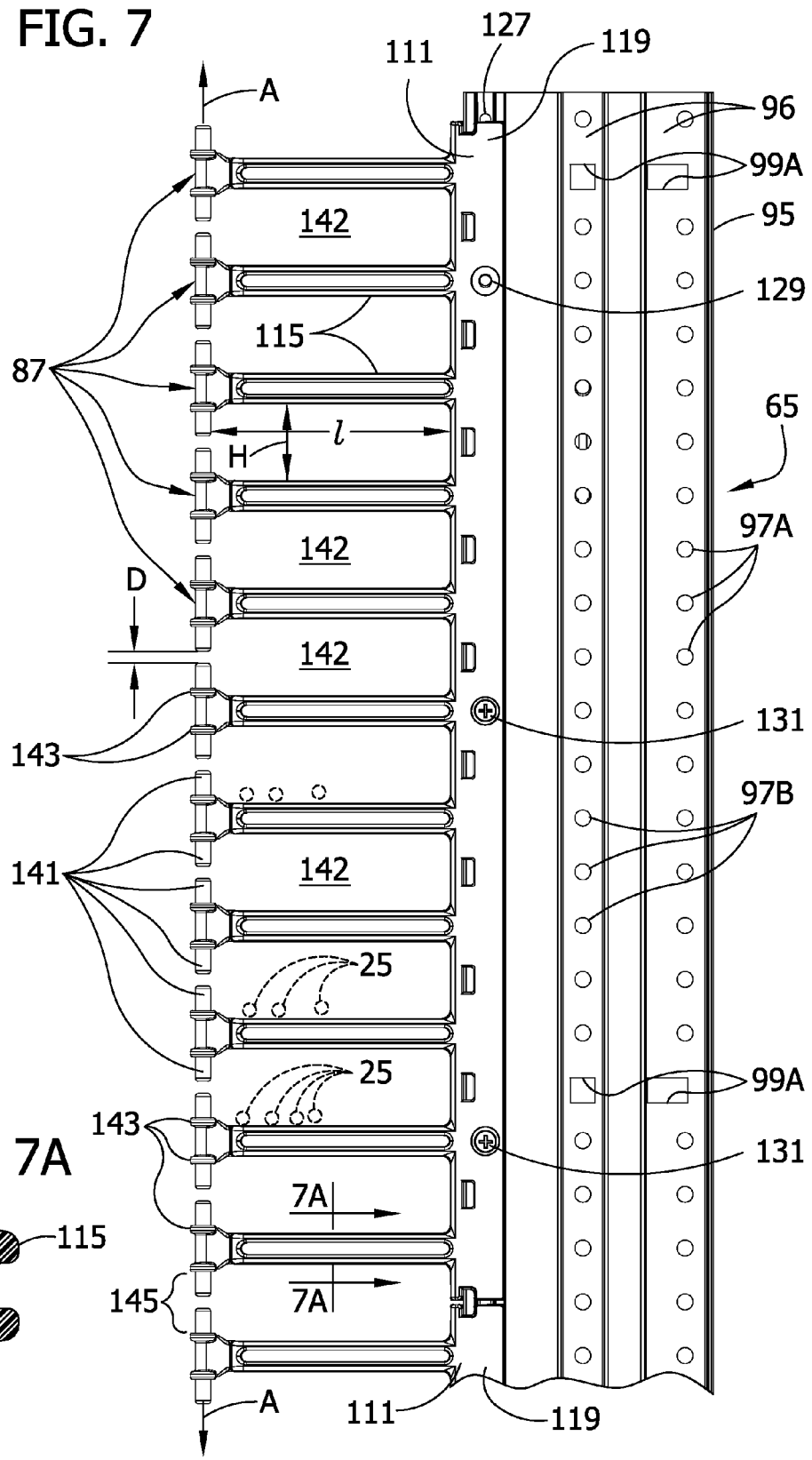
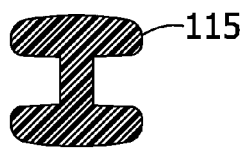
FIG. 7
FIG. 7A

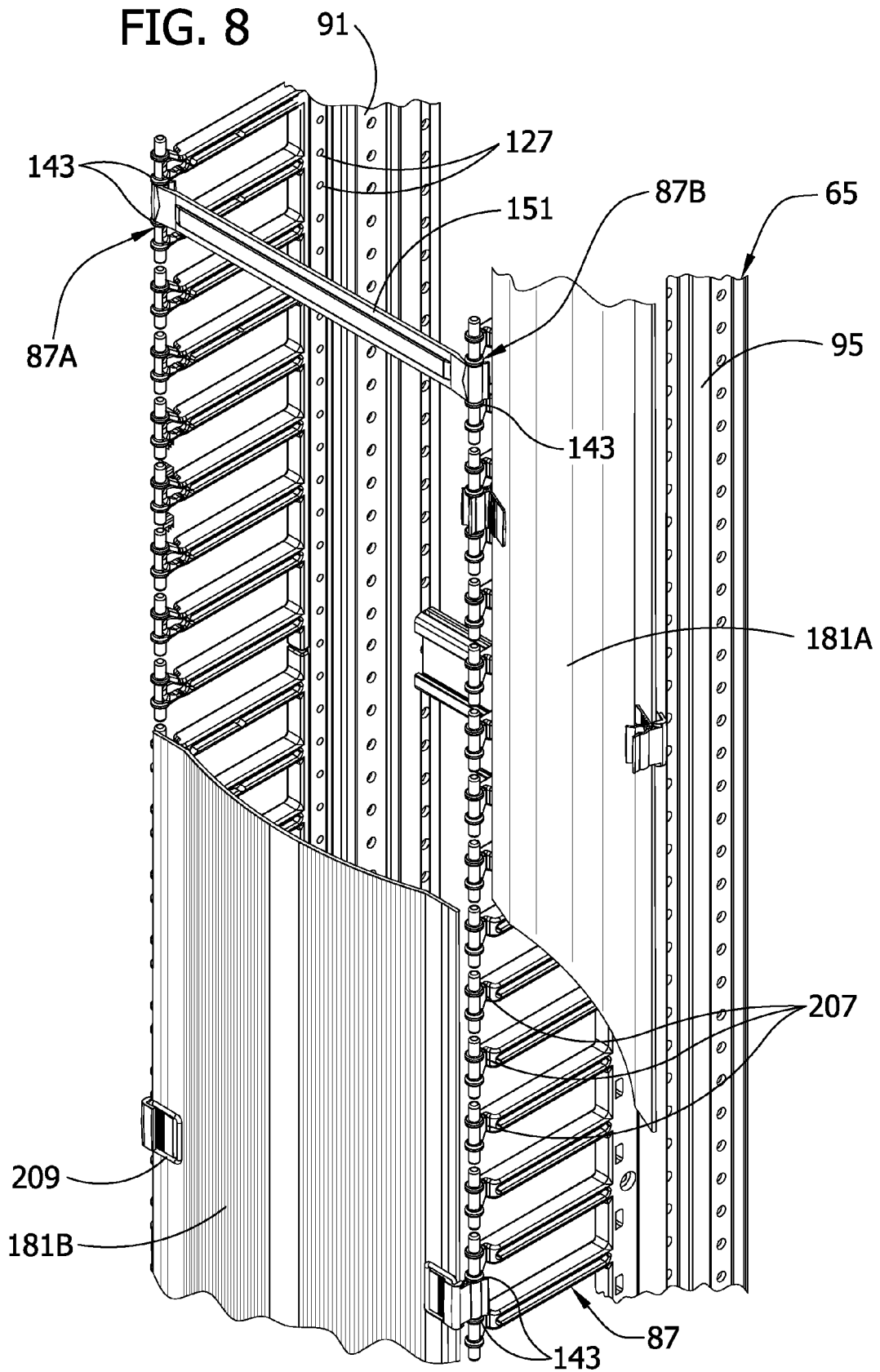

CABLE MANAGER WITH ADJUSTABLE CABLE GUIDES

CROSS-REFERENCE TO RELATED APPLICATION

This application is a division of and claims the benefit of the filing date of U.S. patent application Ser. No. 11/333,063, filed Jan. 17, 2006 which is a non-provisional of 60/645,803, filed Jan. 21, 2005. The entire text of the above-referenced non-provisional application is hereby incorporated herein by reference.

BACKGROUND OF THE INVENTION

This invention relates generally to electronic equipment racks, and particularly to cable management systems for such racks adapted to maintain groups of one or more cables separate from one another.

In general, prior art cable managers do not have the desired flexibility for routing cable, and there is a need for an improved system which provides such flexibility in a number of ways.

SUMMARY OF THE INVENTION

In general, a cable management system for routing cable with respect to electronic equipment is disclosed. The cable management system comprises a cable manager adapted to define a cable path. The cable manager comprises a left side comprising a left side wall, a right side comprising a right side wall, and a rear side which is substantially open to facilitate passage of cables to and from the cable manager. The cable manager also comprises at least one cross member spanning the substantially open rear side and connecting the left and right side walls. Cable guides project forward from the left and right side walls for maintaining groups of one or more cables separate from one another.

In another embodiment, a cable manager for routing cable with respect to electronic equipment comprises opposing side walls defining opposite sides of a cable path. At least one set of cable guides projects forward from one or both side walls for maintaining groups of one or more cables separate from one another. The at least one set of cable guides comprises a base mounted on the side wall, at least three adjacent but spaced-apart cantilever arms projecting forward from the base and cooperating with the base to form at least two cable guides for receiving cable. At least one single cable guide projects forward from one or both side walls for maintaining groups of one or more cables separate from one another. The at least one single cable guide comprises a base mounted on the side wall and two adjacent but spaced-apart cantilever arms projecting forward from the base and cooperating with the base to form a single cable guide for receiving cable. The single cable guide is formed separate from the any other cable guide.

In still another embodiment, a cable management system comprises a cable manager adapted to define a cable path. The cable manager comprises a left side comprising a generally vertical left side wall, and a right side comprising a generally vertical right side wall. At least one of the side walls comprises a series of holes spaced along the side wall and adapted for mounting one or more cable retention devices.

In yet another embodiment, the cable management system comprises a cable manager adapted to define a cable path. The cable manager comprises a left side comprising a left side wall, and a right side comprising a right side wall. At least one of the side walls comprises a series of holes spaced vertically along the side wall and adapted for mounting one or more cable guides. At least a portion of the holes of the series of holes generally corresponds to the position of the electronic equipment mounted on the rack.

Another embodiment comprises cable manager for routing cable with respect to electronic equipment mounted on a frame having equipment mounting holes therein vertically spaced at repeating intervals related to a vertical dimension of a standard rack mounting unit (RMU). The cable manager comprises at least one generally vertical side wall, a set of one or more cable guides adapted to be attached to the at least one side wall, and a series of fastener holes in the at least one side wall for mounting the one or more cable guides on the side wall. The fastener holes are vertically spaced at regular intervals corresponding to a fraction of the RMU vertical dimension whereby the one or more cable guides can be selectively mounted at locations corresponding to said electronic equipment mounted on the frame.

In another embodiment, a cable management system for routing cable with respect to electronic equipment comprises a cabinet and a cable manager affixed to the cabinet to define a cable path. The cable manager comprises at least a first side wall, and at least a first set of one or more cable guides projecting forward from the first side wall for maintaining groups of one or more cables separate from one another.

In another embodiment, a cable management system of the present invention comprises a cable manager adapted to define a cable path. The cable manager comprises a first side comprising a first side wall, and second side comprising a second side wall. At least one cable bar is provided for spanning the first and second side walls and for segregating or containing cable in the cable path. The at least one cable bar has opposite ends releasably attachable to respective side walls. The cable bar is claimed both separate from and in combination with a cable manager.

In another embodiment, a cable management system of the present invention comprises at least one side wall and a set of one or more cable guides on the least one side wall projecting forward from the at least one side wall. The cable guides are attachable to the at least one side wall in a manner which permits the location of the one or more cable guides to be changed after initial attachment to the at least one side wall.

Other objects and features will be in part apparent and in part pointed out hereinafter.

BRIEF DESCRIPTION OF THE DRAWINGS

FIG. 7 is an enlarged partial right side elevation of the cable manager of FIG. 5;

FIG. 7A is a section of the cable manager taken in the plane including line 7A-7A of FIG. 7;

FIG. 8 is a front perspective of a portion of the cable manager of FIG. 5 with a closure and a gate;

Corresponding parts are designated by corresponding reference numbers throughout the several views of the drawings.

DETAILED DESCRIPTION OF THE INVENTION

Figure 1:
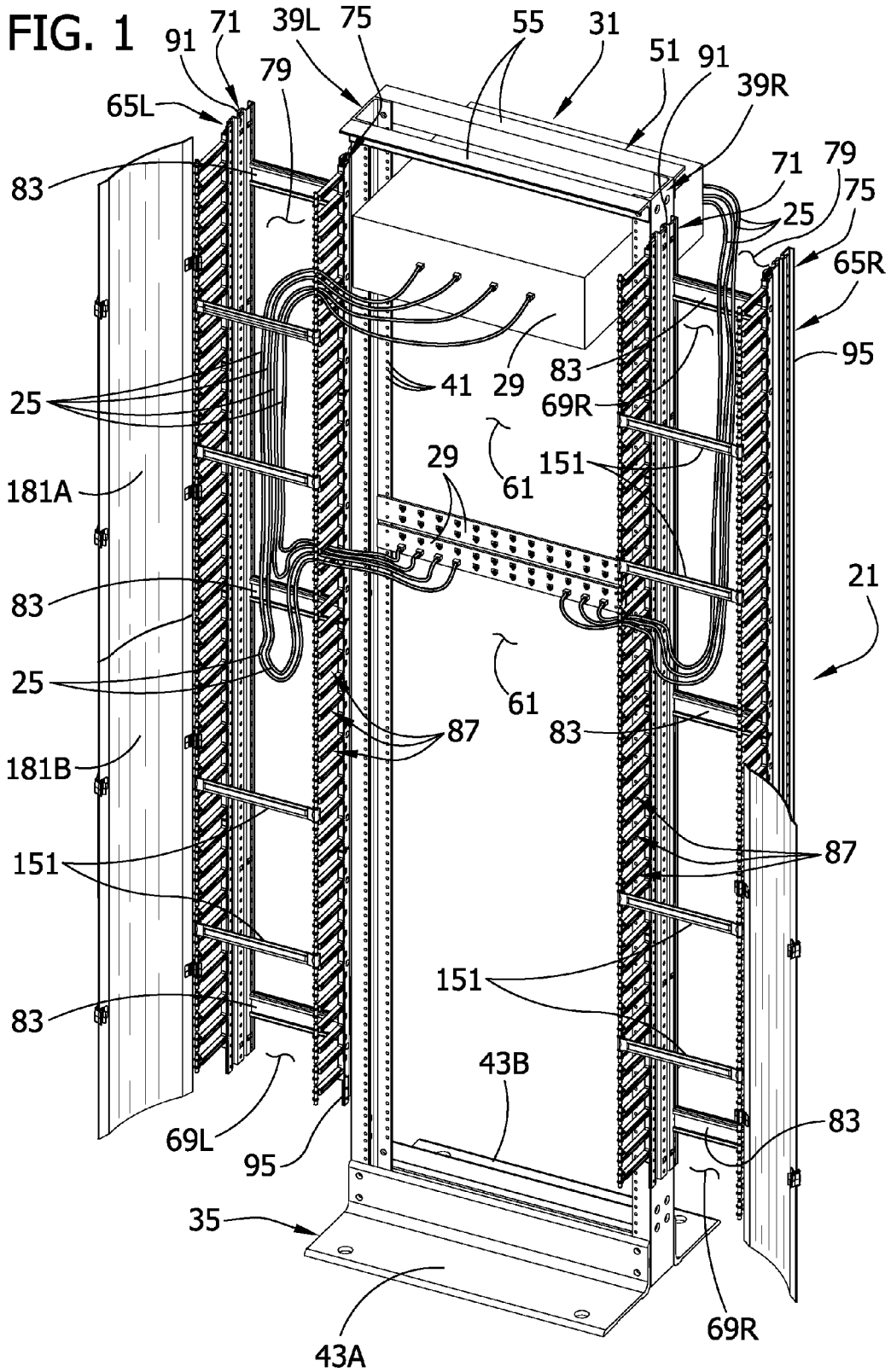
FIGS. 1-4 are front perspectives of several embodiments of a cable management system of this invention.

Referring to FIG. 1 of the drawings, one embodiment of a cable management system of this invention is designated in its entirety by the reference numeral 21. In general, the cable management system 21 routes cable 25 with respect to electronic equipment 29. As described below, this equipment may be mounted on a rack, such as the one generally indicated at 31 in FIG. 1, but it will be understood that the cable management system of this invention can be used without a rack. Electronic equipment 29 may include various types of telecommunications equipment (e.g., patch panels), but it will be readily understood by one skilled in the art that the cable management system is suitable for mounting other types of equipment as well, without departing from the scope of this invention.

Electronic Equipment Rack

As depicted in FIG. 1, the rack 31 comprises a bottom frame structure, generally designated 35, and at least two uprights, each generally designated 39, secured to the bottom frame structure and extending up from the structure at left and right opposite sides of the rack. The uprights 39 include mounting features, such as equipment mounting holes 41, spaced at first repeating intervals related to the vertical dimension or height of a mounting panel carrying electronic equipment. (Two such panels 29 are shown mounted below a larger piece of equipment in FIGS. 1-3.) This vertical dimension is commonly referred to as a standard rack mounting unit or "RMU". Racks 31 with holes 41 exhibiting RMU spacing are well known in the art. This spacing provides flexibility in locating and mounting standardized components at any number of regular, consistent intervals. Further, components designed for RMU spacing may be used on a variety of racks or mounting rails without the need for modification. Typical RMU vertical dimensions are 1.75 in. and 2.0 in., but other dimensions are possible. Where the RMU vertical dimension is 1.75 in., the equipment mounting holes 41 in the rack (or other mounting structure) are typically spaced at repeating intervals of 0.625 in./0.625 in./0.50 in., 0.625 in./0.625 in./0.50 in., 0.625 in./0.625 in./0.50 in., etc. For a RMU having a 2.0 in. vertical dimension, the equipment mounting holes are typically spaced at repeating intervals of 1.0 in./1.0, etc. Other repeating intervals (hole patterns) are sometimes used. In any event, the relationship between the RMU vertical dimension and the vertical spacing of the mounting holes is standard and well known in the telecommunications industry.

The bottom frame structure 35 may include one or more bottom frame members, such as the two generally L-shaped plates 43A, 43B depicted in FIG. 1. One plate 43A mounts on a front face of the uprights 39, and the other plate 43B mounts on a rear face of the uprights.

In addition, a fewer or greater number of uprights 39 may be utilized without departing from the scope of this invention. In the example depicted in FIG. 3, four uprights 39 are included, two for each of the left and right sides of the rack. These uprights 39 are generally rectangular in cross section, but other cross-sections are possible (e.g., circular, square, C-shaped, L-shaped, Z-shaped, triangular, among others). In addition, horizontal stabilizers 47 extend front to rear between the respective left and right uprights 39, thereby connecting the front uprights to the rear uprights at respective sides of the rack 31.

Figure 2:
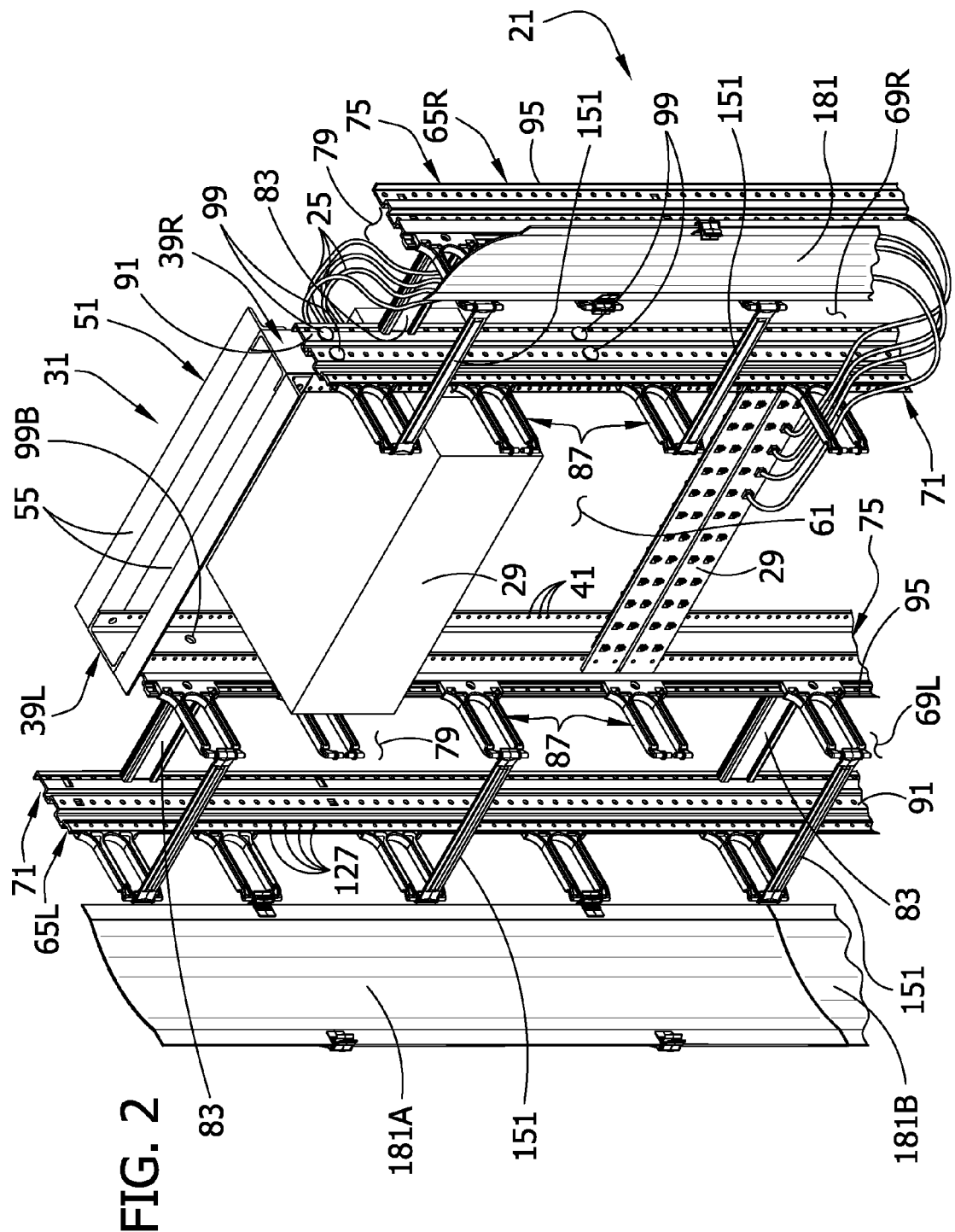
Figure 3:
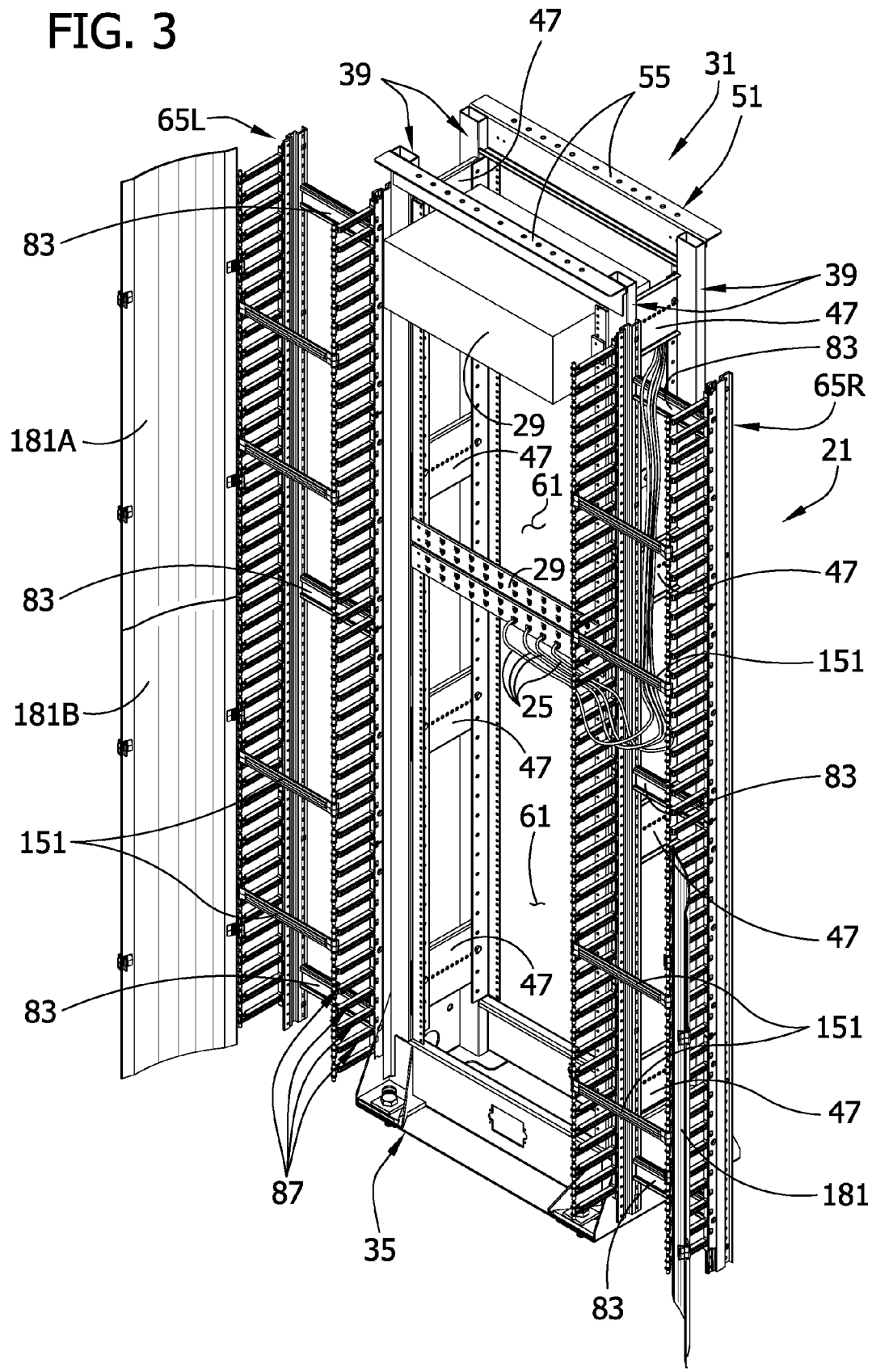
Figure 4:
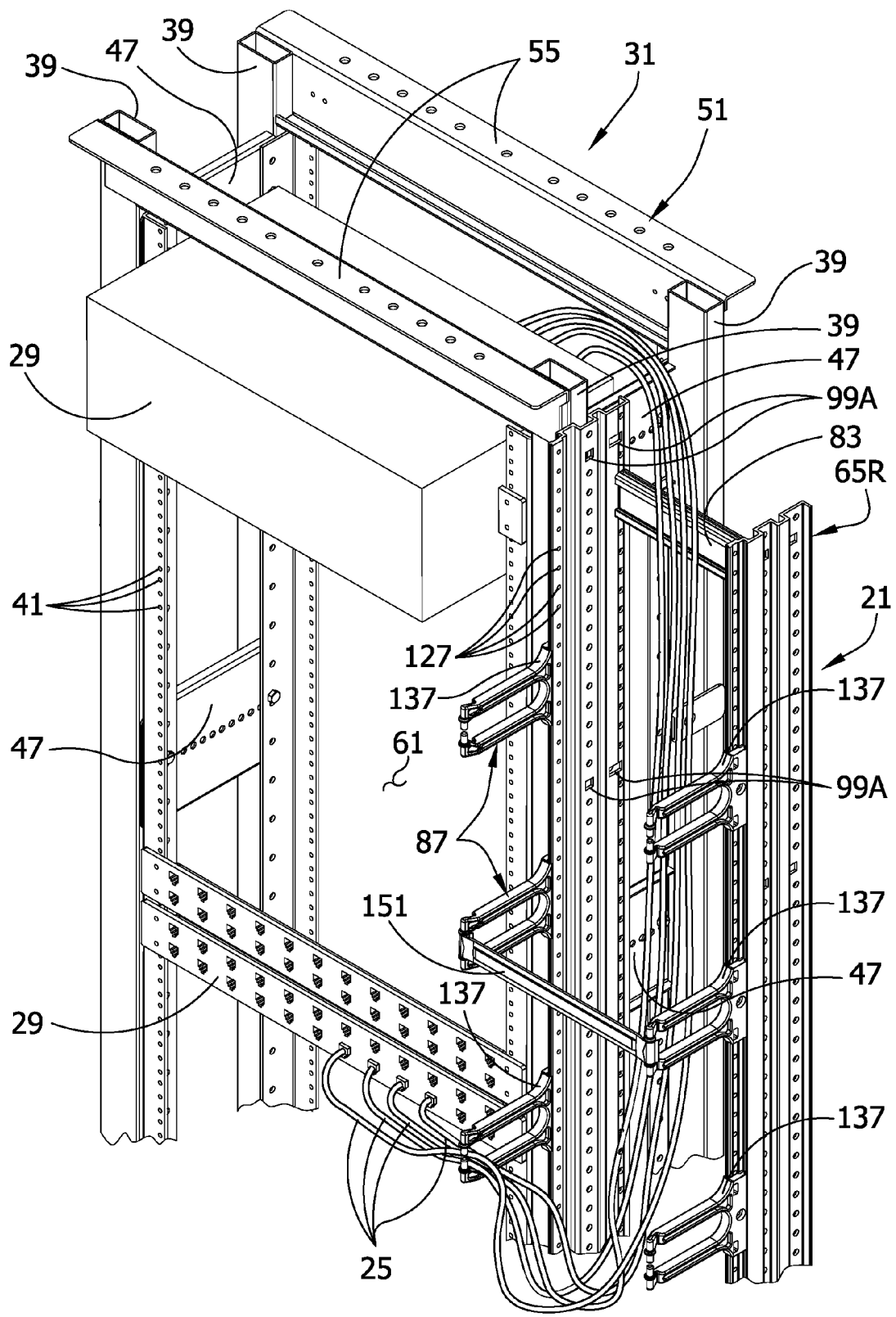

Referring to FIGS. 1-4, each of the racks 31 may also include a cross frame structure, generally designated 51, secured to and extending between the left and right uprights 39. In FIG. 1, the cross frame structure 51 comprises two angle bars 55, one mounted on the front face of the uprights 39 and another mounted on the rear face of the uprights near the top of the rack 31. The cross frame structure 51 may mount on the rack 31 at virtually any vertical location, but is typically mounted near the top of the rack. In FIGS. 3 and 4, the cross frame structure 51 also comprises a front angle bar 55 and a complementary rear angle bar.

The bottom frame structure 35, uprights 39, and cross frame structure 51 shown in the examples of FIGS. 1 and 3 cooperate to define racks 31 of conventional design. Each rack 31 defines a large bay 61 framed by the bottom frame structure 35, the uprights 39, and the cross frame structure 51 for receiving and mounting the electronic equipment 29. Such racks 31 are conventional and are depicted here to illustrate the environment in which the cable management system 21 is used. As would be readily understood by one skilled in the art, modifications to the racks 31 may be implemented without departing from the scope of this invention.

Cable Managers

Turning now to this invention, the cable management system 21 comprises a left cable manager, generally indicated 65L, and a right cable manager, generally indicated 65R (FIGS. 1-4). The left cable manager 65L is adapted to be attached to the left upright 39L of the rack 31 to define a left cable path 69L. The right cable manager 65R is adapted to be attached to the right upright 39R of the rack 31 to define a right cable path 69R. The cable managers can be mounted on structures other than racks, e.g., in cabinets, on walls, floors, ceilings, or other surfaces or frames. In any event, the cable path 69L,69R defined by each manager provides a routing framework for routing cables 25 extending to and from the electronic equipment 29. Racks 31 may be constructed with two (or more) cable managers 65, as depicted in FIGS. 1-3, or may be constructed with a single (e.g., right) cable manager, as depicted in FIG. 4. Both constructions are contemplated as within the scope of the present invention. Moreover, where each rack 31 has a single cable manager 65 (e.g., FIG. 4), several racks 31 may be connected side-by-side one another so that the cable manager of one rack also serves as a second cable manager of an adjacent rack. Descriptions herein directed to racks 31 having two or more cable managers 65 are readily applicable to those racks having single cable managers, and vice versa. Further, descriptions relating to a cable manager are applicable to the cable manager regardless of the structure on which it is mounted.

Figure 5:
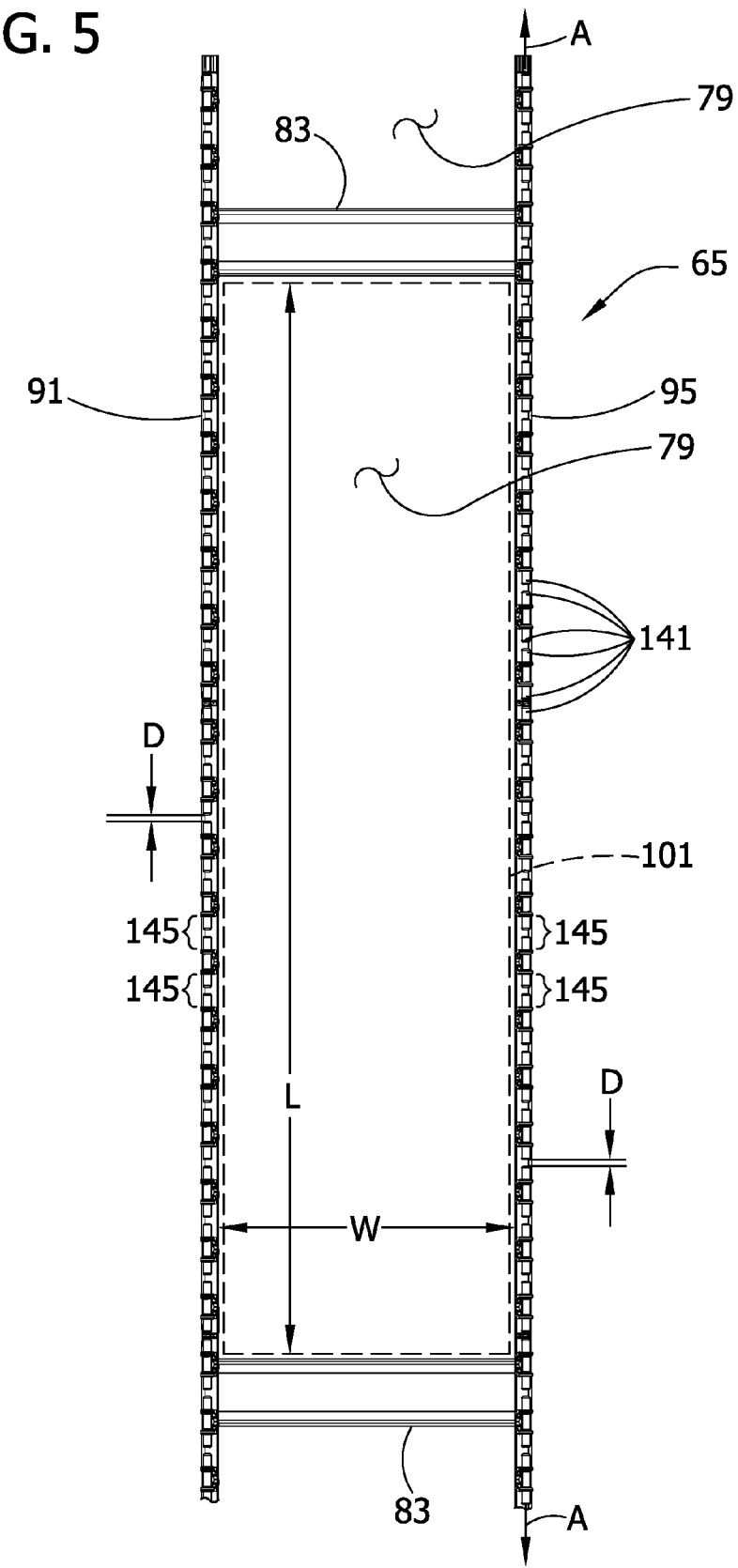
FIG. 5 is a front elevation of a cable manager of this invention.
Figure 6:
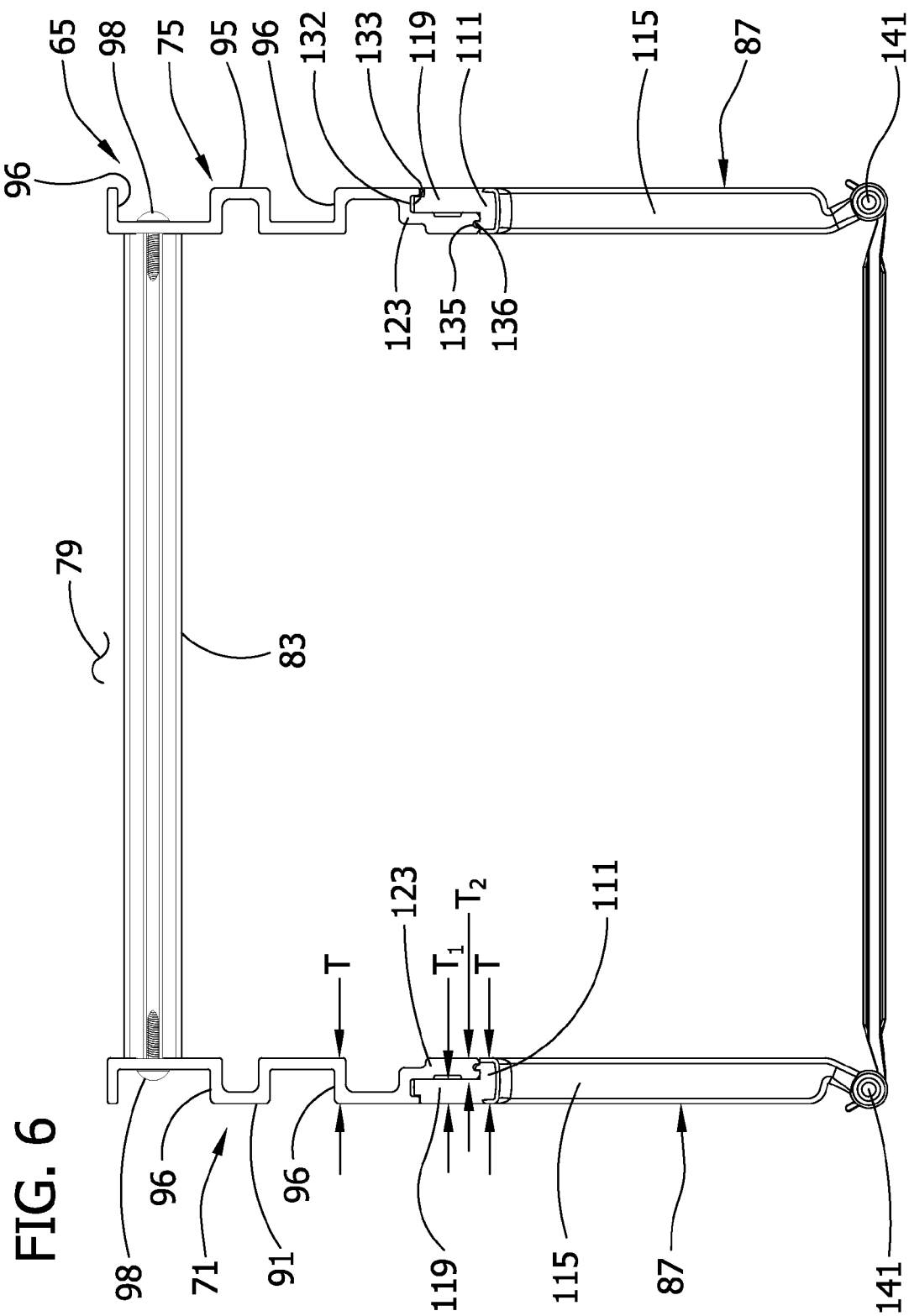
FIG. 6 is a top view of the cable manager of FIG. 5.

Referring now generally to FIGS. 1 and 2, and more specifically to FIGS. 5-7, each of the left and right cable managers 65L,65R comprises a first (left) side, generally indicated 71, a second (right) side, generally indicated 75, a rear side 79, at least one cross member 83, and cable guides, generally indicated 87. For simplicity, only the right cable manager 65R is depicted in FIG. 4, but one skilled in the art would readily understand that one or both of the left and right cable managers 65L,65R may be mounted on a single rack 31 without departing from the scope of this invention. Moreover, the left and right cable managers 65L,65R have one or more similar features, such that description of one cable manager will suffice.

As best shown in FIGS. 2 and 6, the left side 71 of each cable manager 65 comprises a first (left) side wall 91, and the right side 75 similarly comprises a second (right) side wall 95. The side wall of each cable manager 65 closest to the rack 31 (the inboard side wall) mounts on a respective upright 39 with fasteners 99 (see FIG. 2) passing through corresponding holes 99A, 99B in the side wall and upright, respectively. In one embodiment, the fasteners 99 are carriage bolts having rectangular shanks, and the holes 99A and/or 99B are rectangular. By utilizing this fastening arrangement, a nut may be threaded onto the free end of the fastener with a single tool, since the rectangular hole(s) prevents the fastener from turning. Installation of a fastener with a single tool is preferable because it increases the speed of assembly. Other fastening mechanisms are also contemplated as within the scope of this invention.

The side walls 91,95 of each cable manager 65 may be constructed from a variety of materials by a variety of methods without departing from the scope of this invention. In the examples shown, the side walls 91,95 are extruded aluminum, although other metals and nonmetals formed by other methods are also contemplated. In addition, the side walls 91,95 depicted in the drawings have two different depths, with side walls of greater depth being depicted in FIGS. 1, 2, and 4-10, and side walls of lesser depth being depicted in FIG. 3. It should be understood by one skilled in the art that such side walls 91,95 are interchangeable with one another and any description herein relating to one of the side walls is readily applicable to the other. In addition, side walls of greater or lesser depth than those depicted or of different cross-sectional shape are also contemplated as within the scope of this invention.

Figure 9:
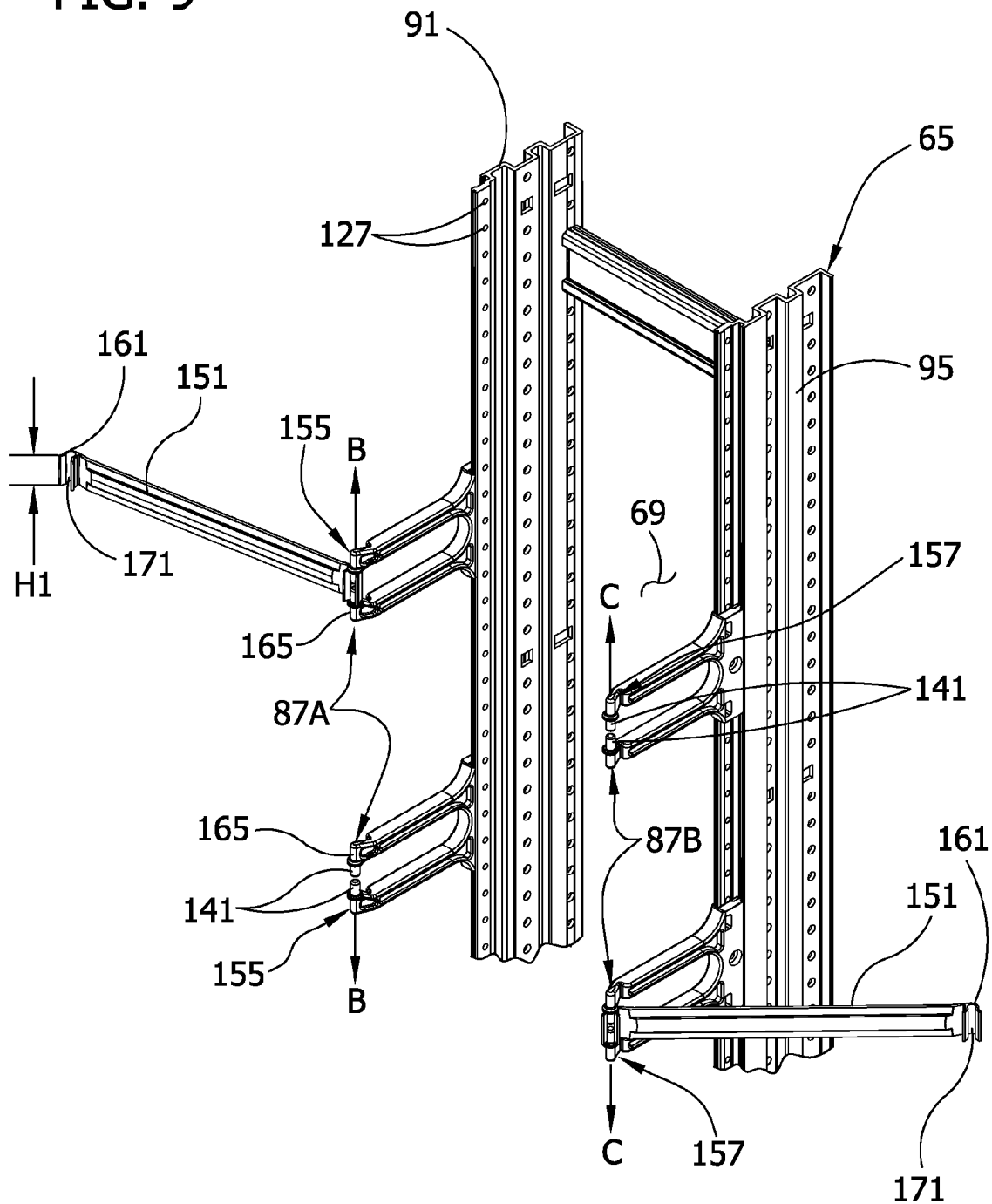
FIG. 9 is a front perspective of a portion of a cable manager and gate of another cable management system of this invention.
Figure 10:
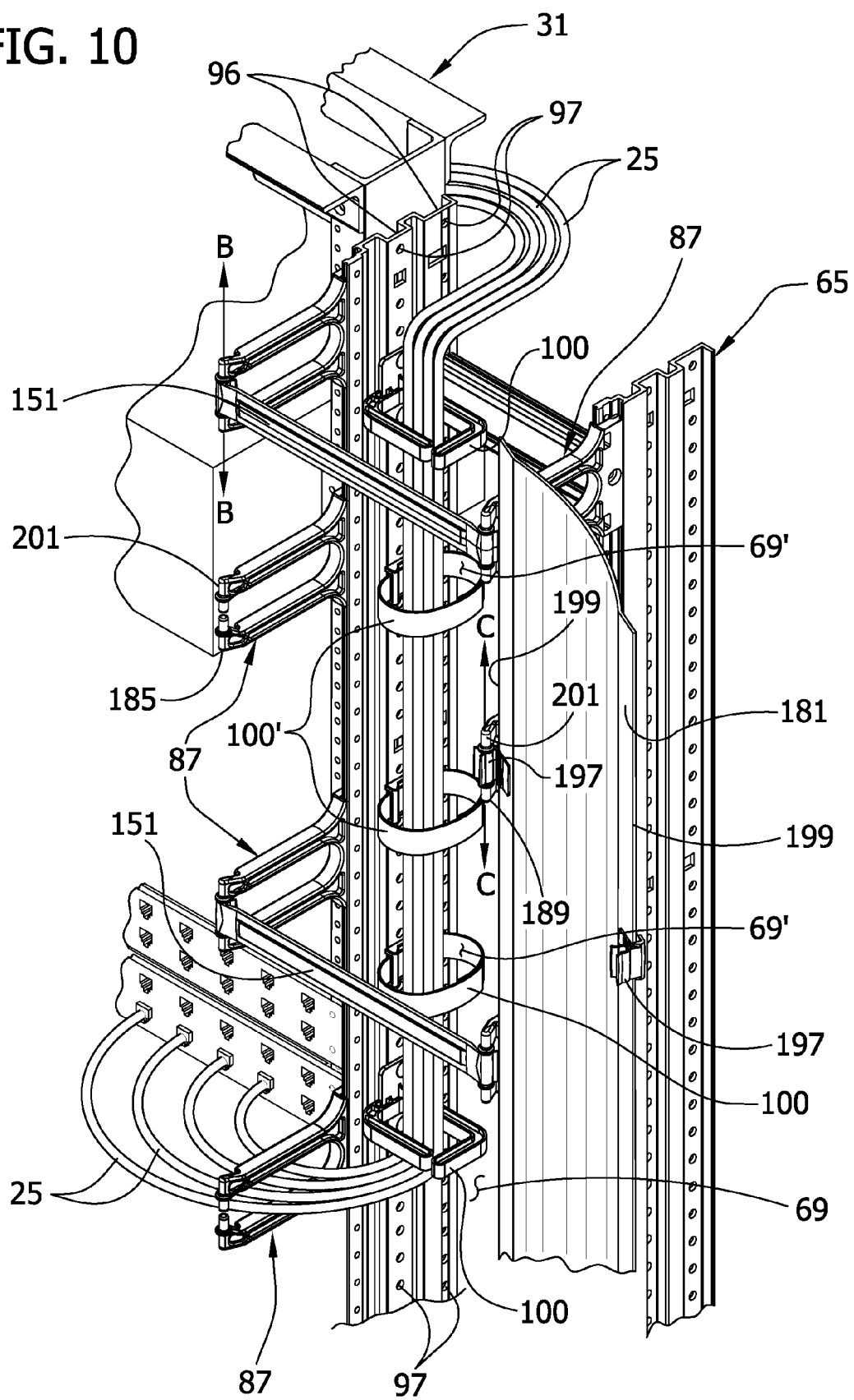
FIG. 10 is a front perspective of a portion of a cable manager, including gates and a closure, of yet another cable management system of this invention.

Referring to FIGS. 6 and 7, each of the side walls 91,95 has a distinctive cross sectional shape. In the examples shown, the side walls 91,95 are mirror images of one another, although they need not be. In particular, each of the side walls 91,95 includes outwardly directed channels 96 having one or more series of vertically spaced holes 97A, 97B spaced along the bottoms of the respective channels (FIGS. 7, 9, and 10). The holes 97A, 97B are designed for receiving a variety of fasteners 98 (discussed below), whereby the channels 96 provide a space for the heads of the fasteners received within the holes 97A, 97B, so that the heads do not extend outward beyond a respective outer face of the side walls 91,95 where they could interfere with the flush mounting of the side walls on other surfaces (e.g., other racks).

In the embodiment shown in FIGS. 7, 9, and 10, two series of vertically spaced holes 97A, 97B are provided in each side wall 91,95. Both series of holes 97A, 97B are arranged in a generally linear pattern substantially parallel to one another. One series of holes 97A is disposed through the web of the channel 96 nearest the rear edge of the side wall 91,95, while the other series 97B is disposed through the web of the other channel, preferably (but not necessarily) generally centrally of the side wall, i.e., generally midway between the front and rear edges of the side wall. The series of holes 97A in the channel 96 nearest the rear edge of the side wall 91,95 is particularly adapted for use in guiding cables 25 from the rear side of the electronic equipment 29 mounted on the rack 31 and into the cable path 69. As shown in FIG. 10, however, the other series of holes 97B may also be used to guide cables 25 from the rear side of the electronic equipment 29 mounted on the rack 31.

In use, the holes 97A, 97B receive fasteners 98 for mounting items on the side walls, such as the cross members 83 or off-the-shelf wire management accessories (e.g., clips, plastic cable guides, cable ties, hook and loop straps, or other such cable retention devices). For example, FIG. 10 shows individual cable guides 100 and individual hook and loop straps 100' mounted on one of the side walls of the cable manager via the holes 97B for retaining and routing cables 25 with respect to the cable manager 65. The individual cable guides 100 and individual hook and loop straps 100' cooperate to define a second cable path 69' disposed at least partially within the cable path 69. The cable guides 100 and individual hook and loop straps 100' may include resilient, plastic, tree clip fasteners having resilient ribs for receipt within the holes 97 for holding the tree clips in the holes. Other suitable fasteners may also be used.

The holes 97A, 97B are preferably (but again not necessarily) located so as to generally correspond to the position of the electronic equipment 29 mounted on the rack 31. For example, the holes 97A, 97B depicted in FIG. 10 can be spaced at regular and uniform intervals corresponding to a whole number multiple (e.g., 1, 2, 3, etc.) or a fraction (e.g., one-half, one-quarter) of the vertical dimension of a standard rack mounting unit (RMU). By utilizing a regular interval smaller than the standard RMU, the user is provided with more mounting locations, which affords greater flexibility in mounting cable retention devices within the cable manager.

As best shown in FIGS. 5 and 6, each cross member 83 spans the substantially open rear side 79 of the cable manager 65, thereby connecting the left and right side walls 91,95. In some embodiments, a plurality of cross members 83 span the rear side 79 of the cable manager 65 and are spaced at vertical intervals along the cable manager. In the example of FIG. 1, three cross members 83 span the rear side 79 of the cable manager 65, one cross member 83 near the top, another near the middle, and a third near the bottom of the cable manager 65. Because the cross members 83 are narrow in a generally vertical direction, the rear side 79 of each cable manager 65 remains substantially open, facilitating passage of loose or bundled cables 25 to and from the cable manager 65 via the rear side of the cable manager at virtually any vertical position, as shown in FIGS. 1-4. (As used herein, the term "bundled cables" means a group or bundle of cables having a diameter generally in the range of one to five inches. Each cable in the bundle is of relatively small diameter, e.g., from about 1/16 in. or less to about 1/4 in.) In one embodiment, the cross members 83 are configured as narrow tie bars, each having an I-shaped cross section, although other cross-sectional shapes are also contemplated as within the scope of this invention.

Maintaining the rear side 79 substantially open is important because it provides greater flexibility in routing cables 25 to and from the electronic equipment 29 from both the front side, the lateral sides 71,75, and the rear side 79 of the cable manager 65 at virtually any vertical position. Cables 25 can enter or exit the cable manager 65 from the front, the rear, and the sides of the cable manager via the cable guides 87. Once outside the cable manager 65, the cables can be routed in any number of directions, including but not limited to upward beyond the top of the rack 31, laterally outward from the sides or rear of the rack to another rack or device, or downward beyond the bottom frame structure 35 of the rack, to name just a few.

In the example shown enlarged in FIG. 5, two cross members 83 span the open rear side 79 of the cable manager 65, and the rear side of the cable manager remains free of cross members over at least about seventy percent of the area of the rear side, whereby cables 25 may be routed at virtually any vertical position. More desirably, the rear side 79 of the cable manager 65 remains free of cross members 83 over at least about eighty percent of the area of the rear side. Even more desirably, the rear side 79 of the cable manager 65 remains free of cross members 83 over at least about ninety-five percent of the area of the rear side. Again, the large unobstructed open areas enhance flexibility in routing cable 25 to and from the electronic equipment 29 from the front side, lateral sides, and rear side of the cable manager 65 at virtually any vertical position.

Moreover, when two or more cross members 83 connect the left and right side walls 91,95 of a respective cable manager 65 (FIG. 5), the side walls and cross members cooperate to define a rear cable port 101 extending the horizontal width "W" of the rear side 78 between the left and right side walls. In one example, the rear cable port 101 has a vertical dimension "L" at least two times the horizontal width "W" of the rear side 79 of the cable manager 65 between the left and right side walls 91,95. In another example, the rear cable port 101 has a vertical dimension "L" at least three times the horizontal width "W" of the rear side 79 of the cable manager 65 between the left and right side walls 91,95. Large rear cable ports 101 such as these afford greater flexibility in routing cables 25 because cables may be routed to and from the cable path 69 via the front side and/or rear side 79 of the cable manager 65 at virtually any vertical position.

FIGS. 13-16 illustrate one embodiment of a cable bar, generally designated 301, for containing or segregating cable in a cable path 69L, 69R defined by the cable manager 65. In this embodiment, the cable bar 301 comprises a pair of bar members 303A, 303B formed, for example, from sheet metal. For simplicity, the bar members 303A, 303B may be identical in construction, each having one or more slots 307 therein and each having one or more pin-like projections 309 extending from one end thereof. In this embodiment, the bar members 303A, 303B are reversed relative to one another, so that the projections 309 project beyond opposite ends of the cable bar 301. The bar members 303A, 303B are held in face-to-face sliding assembly with one another by one or more fasteners 315 (e.g., nut and bolt fasteners) passing through aligned slots 307 in the two bar members. The slots 307 permit the length of the cable bar to be adjusted by sliding or telescoping the two bar members 303A, 303B relative to one another between a retracted position (FIG. 15) in which the cable bar has a first overall length which is reduced to permit the bar to be placed between the two side walls 91, 95 of the cable manager, and an extended position in which the cable bar has a second overall length greater than its first (retracted) length such that the projections 309 are received in respective openings 97A (or 97B) in the two side walls 91, 95 of the cable manager. After installation, the fasteners 315 are tightened to hold the cable bar in its extended and locked position. The fasteners 315 can later be loosened to permit the cable bar to be repositioned on the cable manager or removed altogether.

The cable bar 301 can be constructed in a variety of ways for releasable attachment to respective side walls of a cable manager. For example, the cable bar could attach to the side walls by fasteners, or by clips, or by Velcro, or other means, either with or without the use of openings in the side walls. If holes are provided, the number of projections 309 at opposite ends of the cable bar can vary. Also, other extension designs can be used to permit the length of the cable bar to be adjusted. Further, while the cable bar 301 shown in the drawings is illustrated as extending between the generally centrally located holes 97B of the cable manager, it will be understood that the cable bar can be mounted using the holes 97A closer to the rear edge of the side walls 91, 95, or using other vertically spaced holes provided at other locations. In general, the cable bar(s) is useful to segregate various groups of cables in the cable path defined by the cable manager, and/or to divide the cable path into different areas, and/or to more effectively contain cables within the cable path.

Cable Guides

Referring again to FIGS. 5-7, cable guides 87 project forward from the left and right side walls 91,95 of each cable manager 65 for maintaining groups of one or more cables 25 separate from one another. Each of the cable guides 87 comprises a base 111 mounted on a respective side wall 91,95 and two adjacent, spaced-apart cantilever arms 115 projecting forward from the base. In the examples shown, the arms 115 project forward substantially perpendicular to the base 111 in the same vertical plane and are generally parallel to one another. The arms may extend at other orientations without departing from the scope of this invention. Each arm 115 has an I-shaped cross-section (FIG. 7A) to increase vertical and horizontal strength while reducing material use. Other cross-sectional shapes are also contemplated as within the scope of this invention. The top, side, and bottom surfaces of the arms 115 have curved, or rounded, edges to minimize snagging and damage to the cables 25 passing adjacent the arms.

As best depicted in FIGS. 6 and 7, the base 111 includes a mounting flange 119 extending from the rear of the base generally parallel to the cable guides 87. The mounting flange 119 has a thickness "$T_1$" less than the thickness "T" of the base and the thickness "T" of a respective side wall 91, 95 of the cable manager. In addition, the respective side wall 91,95 associated with the base 111 includes a complementary support flange 123 adapted for flatwise engagement with the mounting flange 119 of the base. In the example shown, the support flange 123 also has a thickness "$T_2$" less than the thickness "T" of the base 111 and the thickness "T" of a respective side wall 91,95. With these reduced thicknesses "$T_1, T_2$," the mounting flange 119 and the support flange 123 face one another for mounting the cable guides 87. Because the combined thicknesses "$T_1, T_2$" of the flanges 119,123 are substantially the same as the thickness "T" of each of the base 111 and side walls 91,95, the cable guides 87 can mount on a respective side wall while maintaining the overall thickness "T" substantially the same as the side walls and the cable guides.

The cooperating flanges 119,123 also maintain the orientation of the cable guides 87 with respect to the respective side walls 91,95 of the cable manager. The support flange 123 of each side wall 91, 95 has a series of fastener holes 127 (FIGS. 2 and 4), and the base 111 of each of the cable guides 87 has one or more fastener holes 129. In one embodiment, the fastener holes 129 are clearance holes and the fastener holes 127 are tapped (threaded) holes. Fasteners 131 (e.g., self-tapping screws) are used to mount the cable guides 87 on respective side walls 91,95 of the cable manager. The vertical row of fastener holes 127 in the cable manager allows the user to install one or more cable guides 87 at a variety of vertical locations along one or both side walls 91,95. This provides added flexibility, so that cable guides 87 may be mounted at numerous vertical positions (see FIG. 12), such as at more precise positions corresponding to the electronic equipment 29 where cables 25 are in need of retention. In this regard, the fastener holes 127 may be located so as to generally correspond to the positions of the electronic equipment 29 mounted on the rack 31.

In one embodiment, the fastener holes 127 in the side walls 91, 95 of the cable manager are spaced at regular intervals corresponding to a fraction of the vertical dimension of the RMU specified for the rack. By way of example, this fraction can be one-half. (Other fractions, such as one-quarter, are possible.) Thus, for a RMU having a vertical dimension of about 1.75 in., the fastener holes 127 can have a uniform vertical spacing of about 0.875 in. By utilizing a regular interval smaller than the standard RMU, the user is provided with more cable guide mounting locations, which affords greater flexibility in mounting cable guides 87 along the cable manager 65. Other fasteners and fastening means are contemplated as within the scope of this invention.

In one embodiment, the spacing between the fastener holes 129 in the base 111 of the cable guide is substantially greater than the spacing between the fastener holes 127. For example, the spacing between fastener holes 129 can be a whole number multiple (e.g., 1, 2, 3, etc.) of the vertical dimension of the RMU specified for the rack (or other frame) being used.

It will be apparent from the foregoing that the vertical locations of the one or more cable guides 87 of this invention can be readily changed as needed and at any time to facilitate routing of the cable to and from the equipment. This is accomplished simply by removing the fasteners 131, moving the desired cable guide or guides to their new location(s), and refastening the cable guide(s) in place using the fastener holes 129 and 127. It is contemplated that other means can be used for attaching a cable guide(s) to a side wall of the cable manager in a manner which permits the location of the cable guide(s) to be changed after initial attachment to the side wall. For example, one or more cable guides could be held in position on one or more of the side walls by friction clamps or gripping mechanisms which enable the cable guide(s) to be slidably or otherwise moved to different locations on the wall(s).

Figure 6A:
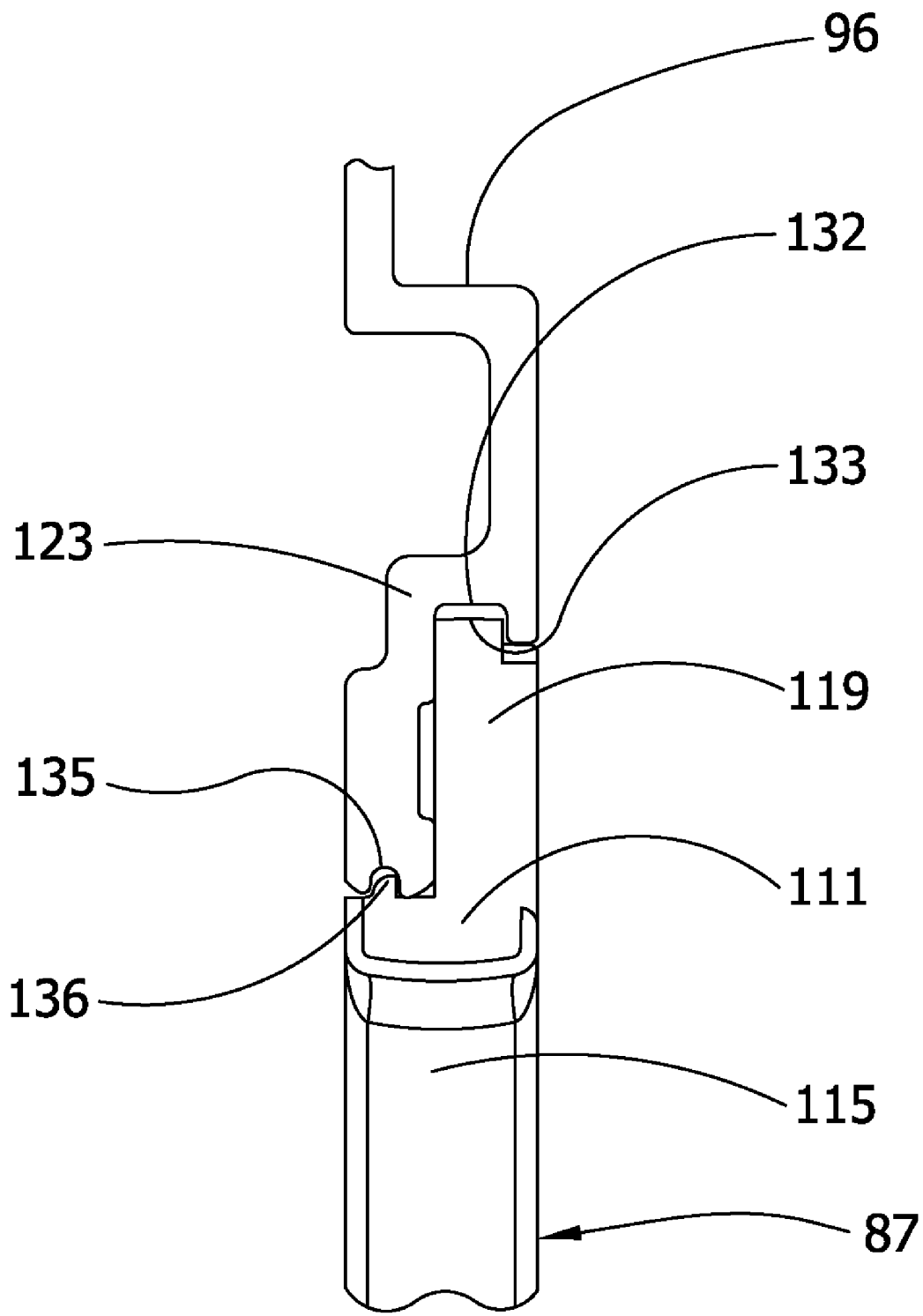
FIG. 6A is an enlarged view of a portion of FIG. 6.

The mounting flange 119 and the support flange 123 may include additional features for supporting the cable guides 87 on a respective side wall 91,95. As best shown in FIG. 6A, the side wall 95 includes a first vertical groove 132 for receiving a first vertically elongate tongue 133 of the mounting flange 119. The first vertically elongate tongue 133 is of reduced thickness and cooperates with the first vertical groove 132 to form a first tongue-and-groove joint for maintaining the lateral position of the mounting flange 119 with respect to the side wall 95.

The support flange 123 of the side wall 95 additionally includes a second vertical groove 135 for receiving a second vertically elongate tongue 136 on the base 111. The second vertically elongate tongue 136 and the second vertical groove 135 cooperate to form a second tongue-and-groove joint for maintaining the lateral position of the base 111 with respect to the side wall 95.

In combination with the fasteners 131, the tongue-and-groove joints maintain a firm connection between the base 111 of the cable guides 87 and the side walls 91,95. Moreover, the tongue-and-groove joints provide lateral support for the portions of the cable guides 87 between the fasteners 131 (see FIG. 7). This design reduces the number of fasteners 131 required to mount the cable guides 87 on a respective side wall 91,95, thereby reducing installation and removal times for the cable guides. The fasteners 131 maintain the cable guides 87 in their desired vertical position, while the tongue-and-groove joints provide much of the lateral support between the flanges 119,123. This lateral rigidity is maintained for relatively long spans between the fasteners 131, which would not be possible with the frequency of fasteners shown without the cooperating tongue-and-groove joints. Moreover, for the single cable guides 87 depicted in FIG. 4, a single fastener 131 mounts the cable guide on the side wall 91,95, such that the tongue-and-groove joints provide lateral and torsional support. As would be readily understood by one skilled in the art, the relative locations of the respective tongues 133,136 and grooves 132,135 may be reversed without departing from the scope of the claimed invention.

The tongue-and-groove joints are particularly helpful because they readily maintain the lateral stability of the cable guides 87 with respect to the side walls 91,95, without additional fasteners or devices. In one example, each side wall 91,95 is extruded (e.g., aluminum) and the cable guides 87 and base 11 are injected molded (e.g., plastic), including the respective tongues and grooves. After the extrusion and injection molding processes, the only additional manufactuguide operation required is the addition of the securement holes 127 in each side wall 91,95.

In the examples depicted in FIGS. 2 and 4, two spaced-apart cantilever arms 115 project forward from each base 111, forming a single cable guide 87. Each single cable guide may be positioned vertically apart from other cable guides in one or more positions along the side walls 91,95 corresponding to the securement holes 127. For example, a single cable guide 87 may be positioned adjacent each piece of electronic equipment 29, so that cables 25 extending to or from the equipment may be routed through the guide. Each of the upper and lower edges of the base 111 of such a cable guide 87 includes a large-radius fillet 137, which creates a substantially smooth transition between the cable guide and the respective side wall 91,95 (FIG. 4). The fillet 137 provides additional support for the arms 115 of the cable guide 87, while reducing the distance the upper and lower edges of the base 111 project forward from a respective side wall 91,95. Minimizing the projection of such edges helps reduce the likelihood of a cable 25 becoming caught or snagged on the upper or lower edge of the cable guide 87.

Any number of spaced-apart cantilever arms 115 can project forward from a single base 111 without departing from the scope of this invention. For instance, in the examples depicted in FIGS. 1 and 3, eleven spaced-apart cantilever arms 115 project forward from each base 111, forming ten cable guides 87 on each base. This group of ten cable guides 87 may be placed adjacent one or more other groups of cable guides along a respective side wall 91,95 to provide a continuous series of cable guides 87 at one RMU spacing, for example. Because the cable guides 87 are adapted to be mounted continuously, as depicted in FIGS. 1 and 3, the upper and lower edges of the base need not have a fillet because adjacent groups of cable guides 87 mount substantially against one another (i.e., vertically abut one another) to minimize the risk of catching or snagging a cable 25. The number of cable guides 87 on each base 111 may vary from one to fifteen or more.

Referring again to FIGS. 5 and 7, each of the cable guides 87 further comprises at least one finger 141 (two fingers in the embodiments shown) extending from one of the arms 115 toward an adjacent arm of the cable guide. The fingers 141 preferably (but not necessarily) extend substantially perpendicular from respective arms 115 and are included to help maintain the cables 25 within the cable guides 87. Without such upstanding or downwardly directed fingers 141, cables 25 might tend to slip out of a particular cable guide 87 due to movement of electronic equipment 29 or other cables. With the fingers 141, however, cables 25 are less likely to inadvertently exit the space defined by the desired cable guide 87. As best shown in FIGS. 5 and 7, each of the arms 115 comprises two fingers 141 extending oppositely from one another along an axis A substantially parallel to and co-planar with the side wall 91,95 from which the respective cable guide 87 projects. The two spaced-apart cantilever arms 115, in particular the fingers 141, are spaced from one another a distance "D" sufficient to allow passage of cables 25 between the spaced-apart arms 115. (In effect, the spaced-apart fingers define a slot having a width D.) The spacing between adjacent fingers 141 may be modified depending upon the thickness of the cables 25 being inserted into the cable guides 87.

In the embodiments shown, the base 111, arms 115, and fingers 141 are formed as a one-piece unitary (e.g., molded) part. As would be appreciated by one skilled in the art, one or more of the base 111, the arms 115, and/or the fingers 141 may be formed as a separate part without departing from the scope of this invention. The base 111, arms 115, and/or fingers 141 may be constructed from a variety of materials, including plastics (e.g., UL94V0 polycarbonate), metals (e.g., aluminum), and ceramics, among others.

The cable guides 87 may be formed in various sizes. In the example of FIG. 7, each cable guide 87 defines a cable guide opening 142 having a horizontal dimension or length "l" of about 9.6 centimeters (3.8 inches) and a vertical dimension or height "H" of 3.2 centimeters (1.3 inches). Other sizes are also contemplated as within the scope of the claimed invention.

The fractional RMU-spacing feature described above in regard to the holes 97A, 97B for the cable retention devices and in regard to the fastener holes 127, is not limited to use on the specific cable manager shown in the drawings or to cable managers having two or more two side walls. Rather, it is contemplated that this feature can be incorporated into any cable manager having at least one side wall (including a cable manager having only one side wall) and cable guides which fasten to the side wall(s). By way of example, referring to FIGS. 1 and 2, a cable manager of this invention could include only the right side wall 95 of the left cable manager 65L and one or more of the cable guides 87 attached to the right side wall 95. Similarly, a cable manager of this invention could include only the left side wall 95 of the right cable manager 65R and one or more of the cable guides 87 attached to the left side wall 95. It is further contemplated that a cable manager of this invention can attach to other types of racks (e.g., 4-post racks) or to frames of other types, including mounting rails, having a standard RMU hole spacing for mounting equipment in need of cable management. Further, a cable manager of this invention can be used as part of a cabinet or completely separate from a cabinet. In any case, the fractional RMU hole spacing on the at least one side wall of the cable manager allows one or more cable guides to be installed at any suitable location or locations corresponding to a particular piece or pieces of equipment mounted on whatever type of frame is used.

FIGS. 17-20 shown an embodiment in which one or more cable guides 87 are integrally formed (e.g., injection molded) as one piece with a respective side wall 91, 95 of the cable manager. In this design, the base 111 of each cable guide merges with the side wall to form an integral, one-piece structure, thus avoiding the need for fasteners.

Gates and Closures

Referring to FIGS. 7 and 8, a guide 143 comprising (in one embodiment) an annular shoulder projects outward circumferentially from the root of each of the fingers 141. The guides 143 on adjacent fingers 141 act to position other parts of this invention with respect to the fingers 141 and arms 115 and also to provide weight beaguide surfaces for such parts. In the examples of FIGS. 8 and 9, gates 151 are adapted to span the gap between a first set of cable guides 87A projecting forward from the left side wall 91 of a respective cable manager 65 and a second set of cable guides 87B projecting forward from the right side wall 95 of the cable manager generally opposite the first cable guides. Each gate 151 pivots between an open position (FIG. 9) to facilitate access to the cable path 69 defined by the cable manager 65, and a closed position (FIG. 8). To facilitate positioning of such gates 151 with respect to the fingers 141 of the cable guides 87, the guides 143 of adjacent fingers cooperate with the fingers to define an attachment space 145 for attaching the gates (FIGS. 5 and 7) and other parts described hereinafter.

Referring now to FIG. 9, a first releasable hinge connection, generally indicated 155, exists between each gate 151 and a respective cable guide 87A for swinging the gate open and closed about a first generally vertical axis B. A second releasable hinge connection, generally indicated 157, exists between the gate 151 and a respective cable guide 87B for swinging the gate open and closed about a second generally vertical axis C. The gates 151 are useful in partially closing the front side of the cable manager 65, such that cables 25 extending within the cable manager are inhibited from extending beyond the front side of the cable manager.

Each of the first and second hinge connections 155,157 comprises a first hinge member 161 on the gate 151 adjacent a respective end of the gate and a second hinge member 165 on a respective cable guide 87 adjacent a forward end of the cable guide. The first and second hinge members 161,165 of the first hinge connection 155 are releasable from one another to permit pivoting movement of the gate 151 about the second generally vertical axis C. The first and second hinge members 161,165 of the second hinge connection 157 are similarly releasable from one another to permit pivoting movement of the gate 151 about the first generally vertical axis B. In particular, the first hinge member 161 on the gate 151 comprises a resiliently flexible channel 171, and the second hinge member 165 on the respective cable guide 87 comprises generally cylindric portions of adjacent fingers 141 of a cable guide. Desirably, the cylindric portions of these fingers are sized for a snap fit within the channel 171. Thus, the fingers 141 may be snapped into the channel 171 to form the hinge connection 155,157 and snapped out of the channel to release the gate 151 from the cable guide 87. Other types of releasable connectors can also be used without departing from the scope of the claimed invention.

Gates 151 may be mounted on any pair of opposed cable guides 87. The gates 151 may be pivoted open or completely removed from the cable guides 87 to route or reroute cables 25 within the cable manager 65. Gates 151 may also be removed from one vertical location and moved to another location as needed. Any number of gates 151 may be used at any selected location(s). In one example, the gate 151 has a vertical dimension or height "H1" (FIG. 9) no greater than the vertical dimension or height "H" of the cable guide opening 142 (FIG. 7). Other embodiments are also contemplated as within the scope of the present invention. For example, the height "H1" of the gate 151 may be greater than "H" but less than 10 RMUs, and preferably less than 7 RMUs, and even more preferably less than 5 RMUs, and even more preferably less than 3 RMUs, and still more preferably less than 2 RMUs, and still more preferably less than 1 RMU, or even one-half RMU.

In the embodiment depicted in FIG. 10, the cable manager 65 comprises a generally vertical closure 181 mounted adjacent the remote (forward) ends of the cable guides 87 for closing a front side of the cable manager. A first releasable connection 185 exists between the closure 181 and the cable guide 87 at one side of the cable manager 65. A second releasable connection 189 exists between the closure 181 and the cable guide 87 at the other side of the cable manager 65. In one embodiment, each of the releasable connections 185, 189 comprises a releasable hinge connection, also indicated 185,189, between the closure 181 and a respective cable guide 87 for swinging of the closure about a generally vertical axis between a closed position and an open portion (FIG. 10) to facilitate access to the cable path 69 defined by the cable manager 65. When closed, the closure 181 substantially hides the contents of the cable manager 65, thereby further fosteguide a clean and organized appearance. The closure 181 may comprise one or more vertically elongate closure panels, such as the two closure panels 181A,181B depicted in FIGS. 1, 3, and 8. The closure is illustrated as extending the entire length of the cable manager, but it will be understood that, regardless of how many closure panels are used, the closure can extend over less than the entire length of the cable manager.

Figure 11:
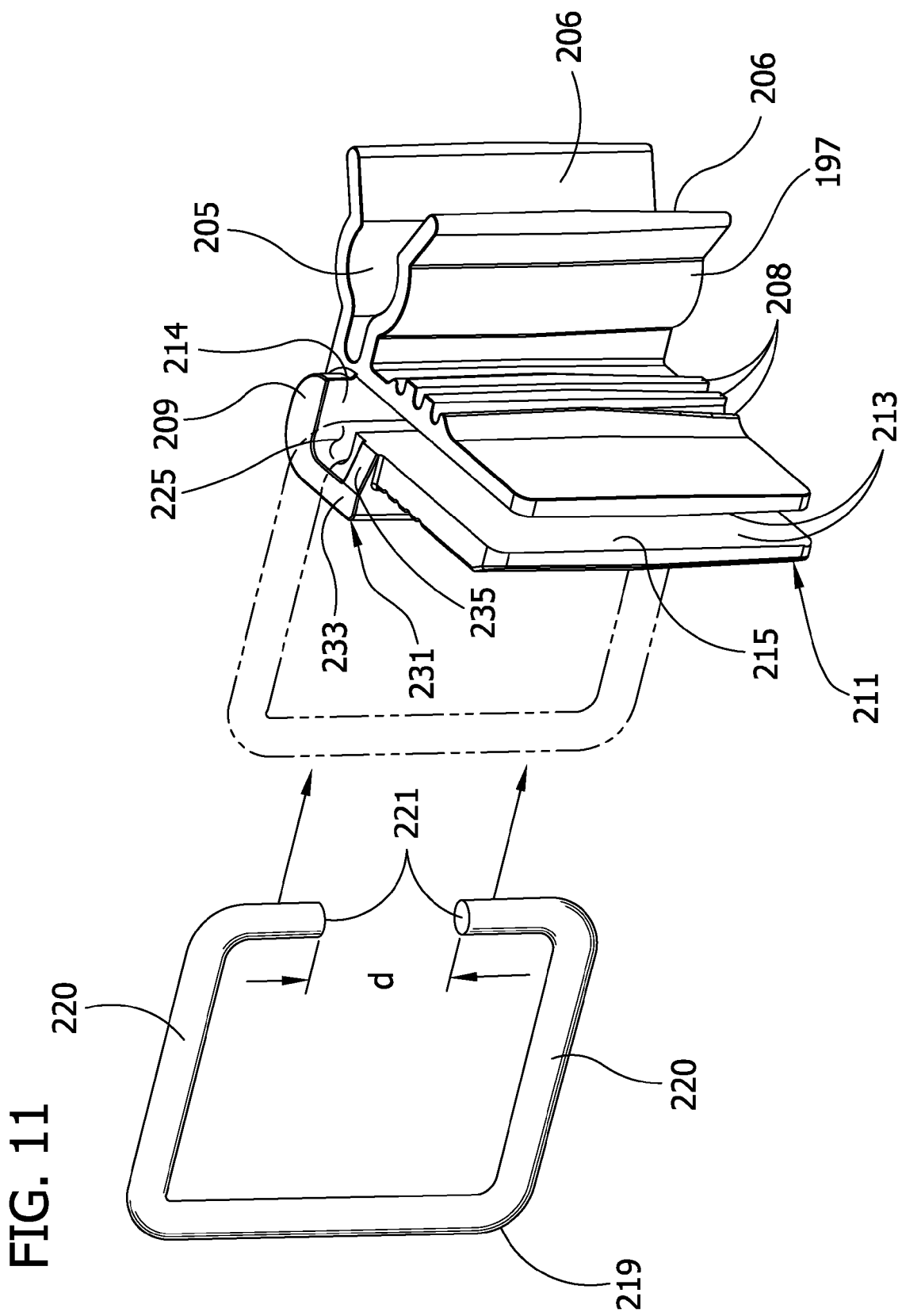
FIG. 11 is a front perspective of a closure handle of yet another cable management system of this invention.

Each of the releasable hinge connections 185,189 comprises a first hinge member 197 on the closure 181 adjacent a respective lateral (vertical) edge 199 of the closure and a second hinge member 201 on a respective cable guide 87 adjacent the forward end of the cable guide. The first and second hinge members 197,201 of the hinge connections 185,189 are selectively releasable from one another to permit pivoting movement of the closure 181 about either axis B or axis C, substantially as set forth above with respect to the gates 151. Further, the first and second hinge members 197, 201 of the hinge connections 185,189 are simultaneously releasable to permit complete removal of the closure 181 from the cable manager 65. As illustrated in FIG. 11, each first hinge member 197 on the closure 181 comprises a resiliently flexible channel 205, and the second hinge member on the respective cable guide comprises the aforementioned generally cylindric portions of adjacent fingers 141 having a snap fit within the channel. The fingers 141 may be snapped into the channel 205 to form the hinge connection 185,189 and snapped out of the channel to release the closure 181 from the cable guide 87. As best shown in FIG. 11, the channel 25 has flared side wall portions 206, which extend outward from the channel 205 to help guide the fingers 141 into the channel. Each of the arms 115 is recessed as indicated at 207 (FIG. 8) so that the closure may be pivoted open more fully, as depicted in FIG. 10, without interfeguide with the arms. Other types of releasable connections can be used without departing from the scope of the claimed invention.

In one embodiment (FIG. 11), the first hinge member 197 mounts on the closure 181 by means of a U-shaped clip, generally indicated 211, having spaced apart legs 213 and a connecting web 214 defining a slot 215 for receiving a lateral (vertical) edge 199 of the closure. The lateral edge 199 of the closure 181 may be held within the slot 215 by a friction fit, one or more detents, an adhesive, a fastener, or any other means without departing from the scope of this invention. Moreover, the slot 215 and/or the closure 181 may further include an alignment feature, such as a cutout (not shown), which corresponds to an alignment feature on the respective closure or slot, to provide precise positioning of the clip 211 with respect to the closure. The leg 213 on the inside surface of the closure 181 may also include several reinforcing ribs 208. Hinge members can be mounted on the closure in other ways without departing from the scope of the claimed invention.

Closure Handles

As shown in FIG. 11, the closure 181 also includes one or more handles 209, each comprising a generally C-shaped loop member 219 of resilient material (e.g., metal wire or rod) having opposing ends 221. Each handle 209 is mounted on the closure 181 for pivotal movement between a stowed position (FIG. 8) in which the loop member 219 is generally flat against the outer surface of the closure, and a pull position (shown in phantom in FIG. 11) in which the loop member projects out from the closure so that it may be readily grasped to facilitate pulling the closure open. In the embodiment shown in FIG. 11, the opposing ends 221 of the loop member 219 are received in upper and lower recesses 225 formed in the leg 213 of the clip 211 on the outer surface of the closure 181, but it will be understood that other mounting arrangements are possible.

A cam, generally indicated 231, is provided on the closure 181 for assisting in holding the loop member 219 in its stowed and pull positions. As shown in FIG. 11, the cam 231 is formed as an integral part of the same clip 211 which mounts a hinge member 197,201 on the closure 181, but it will be understood that the cam could be formed as an integral part of the closure itself, or as a separate element affixed to the closure. In one embodiment, the cam 231 includes an upper cam surface, also designated 231, formed on the outer leg 213 of the clip 211 adjacent its upper edge. This cam surface 231 comprises a ramp 235 sloping up from adjacent the closure 181 and a generally horizontal upper landing 233 extending from the upper end of the ramp. The cam 231 also includes a lower cam surface (not shown) on the outer leg 213 adjacent its lower edge. The lower cam surface is a mirror image of the upper cam surface 231 and comprises a ramp sloping down from adjacent the closure 181 and a generally horizontal lower landing extending from the lower end of the ramp. The arrangement is such that as the loop member 219 is pivoted from its stowed position toward its pull position, upper and lower portions 220 of the loop member first move along respective upper and lower ramps 235, which causes the ends 221 of the loop member to resiliently spguide apart (i.e., the distance "d" in FIG. 11 increases). Further pivoting of the loop member 219 causes these same upper and lower portions 220 of the loop member to move onto respective upper and lower landings 233 of the cam surfaces 231 where the inward resilient force exerted by the loop member against the landings tends to hold the loop member in its pull position. To close the handle 209, the loop member 219 is simply pivoted in the reverse direction, causing the upper and lower portions 220 of the loop member to move along the ramps 235 until the loop member reaches its stowed position in which the ends 221 of the loop member are in their original position spaced apart by the distance "d." The loop member 219 transitions from a partially deformed state to a relaxed state as the upper and lower portions 220 and ends 221 move toward one another duguide pivoting movement along the ramps 235. Because the handle 209 cannot move toward its pull position unless it is forced over the ramps 235, it tends to stay in its stowed position. This helps ensure that the loop member 219 of the handle 209 remains flat against the closure 181 to minimize interference of the handle with personnel or equipment associated with the rack 31.

Cabinet/Housing

Figure 21:
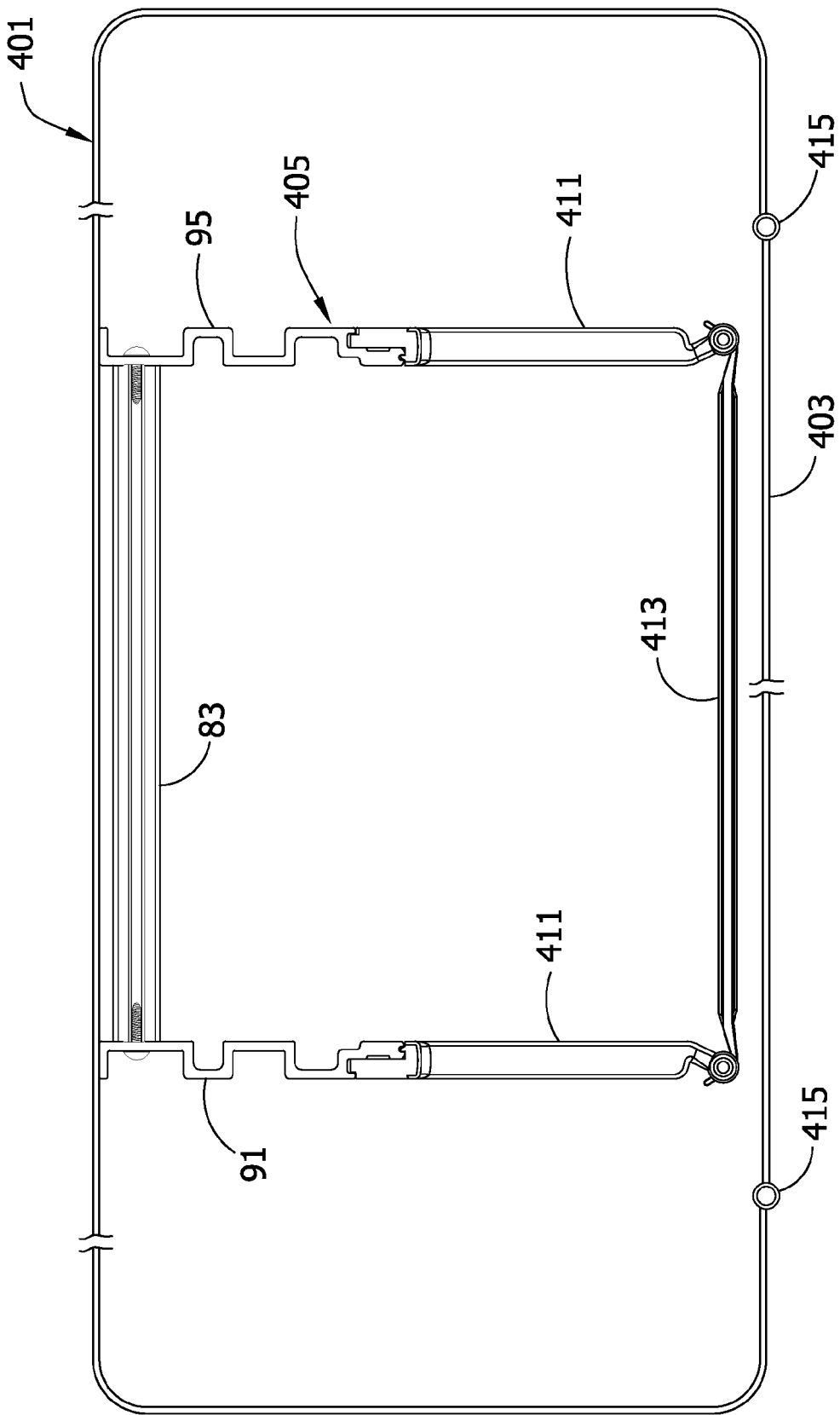
FIG. 21 is a top plan of one embodiment of a cable manager of this invention attached to the back wall of a cabinet or housing having a closure closely adjacent a gate of the cable manager.

In the above embodiments, the closure 181 is mounted on the cable guides 87. In the embodiment of FIG. 21, the closure is part of a cabinet or other housing, generally designated 401, having a door or panel 403 which functions as the closure 181 described above. In this embodiment, a cable manager 405 of this invention, generally similar to the cable manager previously described, is mounted in the cabinet in a position where the door 403, when closed, is positioned closely adjacent the ends of the cable guides 411 to assist in retaining the cable in the cable manager, especially in situations where the number of gates 413 is limited, or where no gates are present. When closed (and optionally locked), the door 403 also provides the aesthetic advantages and security of a cabinet. When the door 403, access to the cable manager is provided. To facilitate such access, the door preferably has a width greater than the width of the cable manager, and the one or more hinge connections 415 of the door to the cabinet are located outboard of the cable manager so that access to the cable manager is unobstructed when the door is opened. The cable manager 405 can be secured in position within the cabinet either by fastening the cable manager directly to a cabinet surface (e.g., a back or side wall of the cabinet), or to a frame inside the cabinet, or to the floor. The cable manager 405 can have any of the features incorporated in the embodiments previously described.

Figure 22:
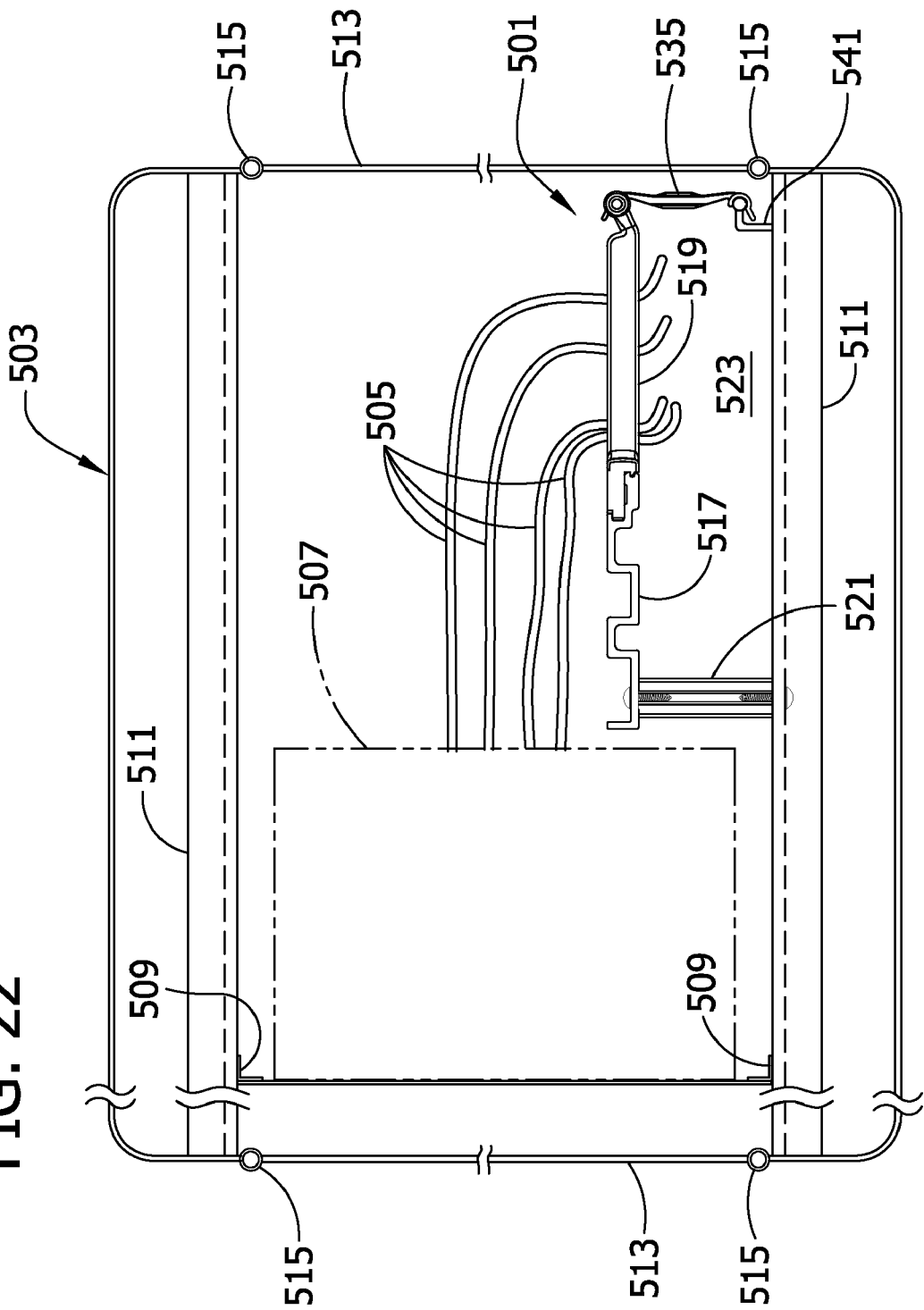
FIG. 22 is a top plan of one embodiment of a cable manager mounted inside a cabinet for managing cable for equipment inside the cabinet.

FIG. 22 illustrates another embodiment where a cable manager, generally designated 501, is positioned in a cabinet 503 for managing cable 505 routed to and/or from equipment 507. The equipment is mounted on vertical mounting rails 509 supported by frame members 511 in the cabinet. The cabinet has two doors 513, each of which is connected by hinges 515 to the cabinet for swinging open in either direction. The number of doors can vary. In this embodiment, the cable manager 501 comprises only one side wall 517 and one or more cable guides 519 projecting from the single side wall. The cable manager is secured in position by one or more supports 521 attached to a side wall of the cabinet or to one or more of the frame members 511 (or other framework) inside the cabinet. As thus installed, the side wall 515 of the cable manager and an opposing surface of the cabinet or framework inside the cabinet combine to define a cable path 533. If one or more gates 535 are used, as described in previous embodiments, a corresponding number of brackets 541 can be mounted on the cabinet or interior framework for releasably holding one end of each gate. Access to the equipment and cable manager is provided by opening one or both doors 513 of the cabinet 503.

Figure 23:
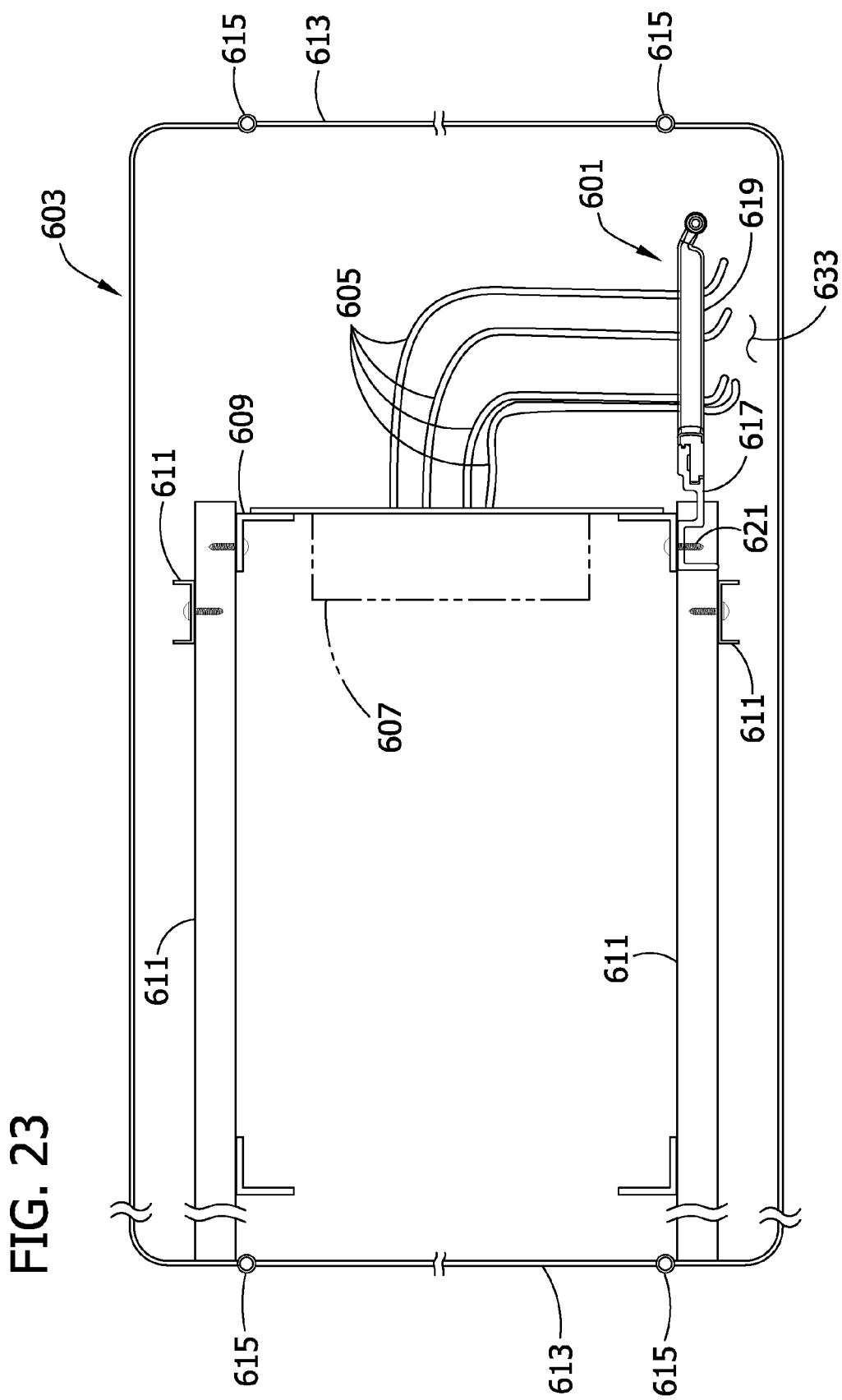
FIG. 23 is a top plan of another embodiment of a cable manager mounted inside a cabinet for managing cable for equipment inside the cabinet.

FIG. 23 illustrates still another embodiment where a cable manager, generally designated 601, is positioned in a cabinet 603 for managing cable 605 routed to and/or from equipment 607. The equipment is mounted on vertical mounting rails 609 supported by a frame 611 in the cabinet. The cabinet 603 again has two doors 613, each of which is connected by hinges 615 to the cabinet for pivoting open in either direction. The number of doors may vary. In this embodiment, the cable manager 601 comprises only one side wall 617 and one or more cable guides 619 projecting from the single side wall. The side wall 617 of the cable manager 601 is fastened to one of the mounting rails 609 by fasteners 621 extending through a first series of vertically spaced equipment mounting holes in the mounting rail (similar to equipment mounting holes 41 in the rack 31) and a second series of vertically spaced fastener holes in the side wall 617 of the cable manager (similar to holes 127 in the side walls 91, 95 of the cable manager of the first embodiment). The equipment mounting holes in the mounting rails 609 preferably have the aforementioned RMU spacing, and the fastener holes in the side wall 617 of the cable manager are spaced at regular vertical intervals corresponding to a fraction of the RMU vertical dimension. As thus installed, the side wall 617 of the cable manager combines with the a wall 631 of the cabinet or interior framework to define a cable path 633. Access to the equipment and cable manager is provided by opening one or both doors 613 of the cabinet 603.

General Operation

In use, the cable manager 65 provides for convenient and simple routing of cables 25 with respect to the equipment rack 31. In particular, cables 25 may extend from either the front or rear of the electronic equipment 29 into the cable manager 65 at virtually any vertical position, as depicted in FIG. 1. Cables 25 are freely routed through the multiple cable guides 87 associated with the cable managers 65 and through any number of additional cable retention devices mounted on the side walls 91,95 via the holes 97A, 97B (e.g. cable guides 100 and individual hook and loop straps 100'. The cable guides 87 and cable retention devices provide support for the cables 25 as they enter or exit the cable managers 65 at virtually any vertical position. The inboard cable guides 87 directly adjacent the rack 31 generally route cables 25 to and from the electronic equipment 29 mounted on the rack. The outboard cable guides 87 located on the outside of the cable managers 65 are spaced from the rack 31 and generally route cables 25 to adjacent cable managers, racks, or other electronic equipment 29, as would be understood by one skilled in the art.

Once routed, appropriate gates 151 and/or closures 181 may be mounted on the cable managers 65 to retain the cables 25 and foster a clean and organized appearance. If cables 25 require rerouting, existing cables need to be removed, or additional cables need to be added, the gates 151 and/or closures 181 may be temporarily pivoted or removed to facilitate such management of the cables. Moreover, the rear side 79 of the cable manager 65 remains substantially open so that cables 25 may be routed to and from the rear of the cable manager 65 at virtually any vertical position. This feature provides greater flexibility in cable 25 routing, allowing the user to minimize cable path length with direct cable routing from the cable manager 65 to the rear of a piece of electronic equipment 29.

As depicted in FIG. 10, one or more gates 151 and the closure 181 can span the gap between the cable guides 87 simultaneously. With the gates 151 and closure 181 in place, the closure may be opened to gain access to the cable path 69, while the closed gate(s) retains the cables 25 within the cable manager 65. When necessary, one or more gates 151 may additionally be opened for routing or rerouting of cables 25. It should be understood that the gates 151 and closures 181 may be used together on the same cable manager 65. Alternately, one cable manager may have only gates, while another has only closures. The combined use of one or more gates 151 with one or more closures 181 is applicable to the cable managers 65 having open rear sides described herein, and also to cable managers 65 having closed, or substantially closed, rear sides.

Figure 12:
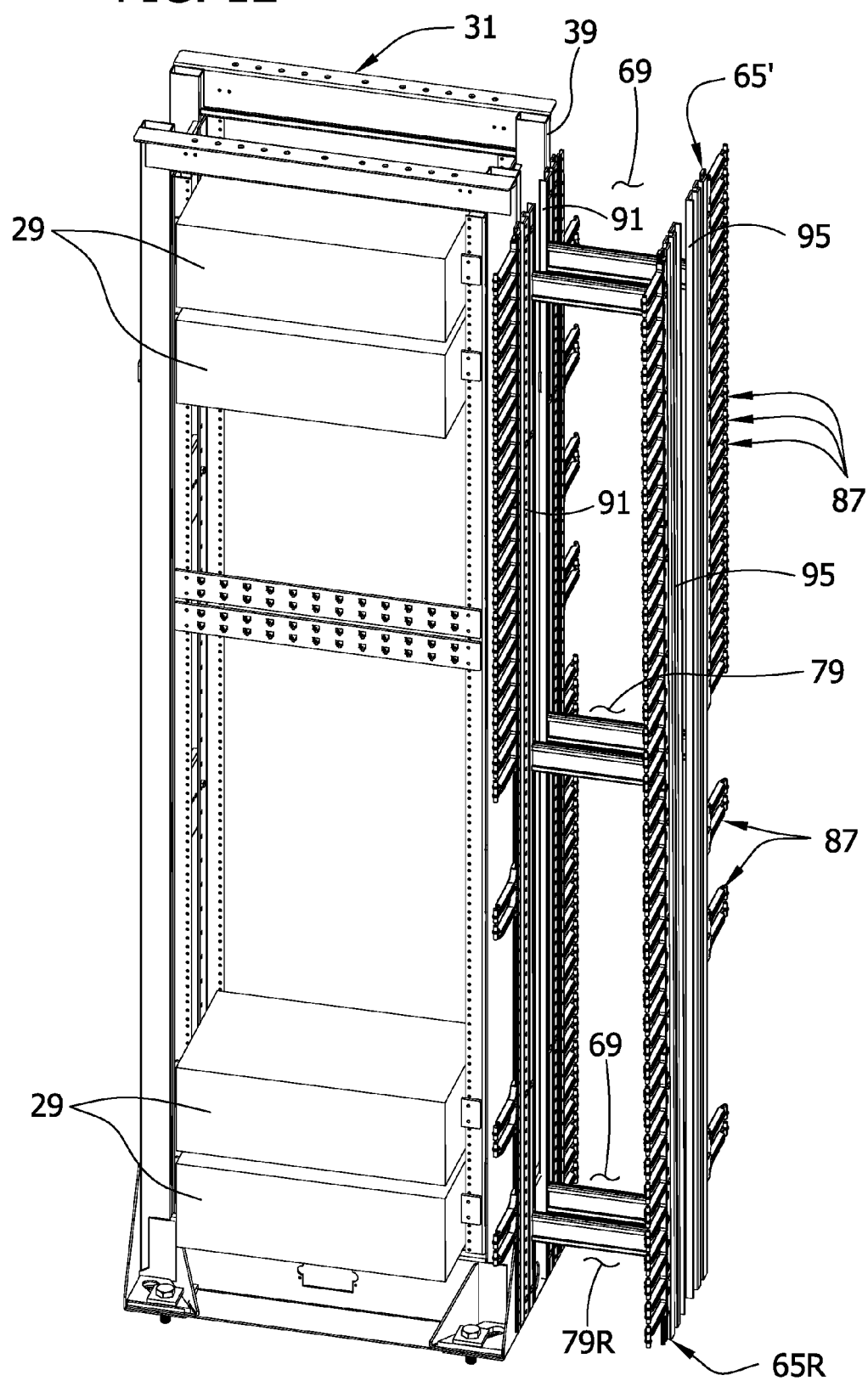
FIG. 12 is a front perspective of another embodiment of a cable management system of this invention.
Figure 13:
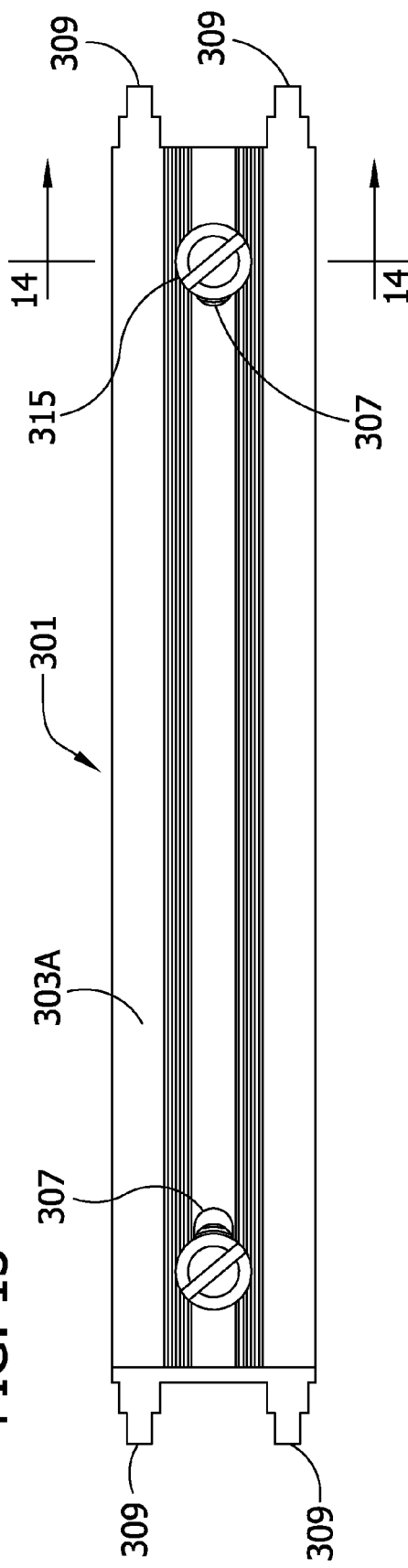
FIG. 13 is a front elevation of one embodiment of a cable bar of this invention.
Figure 14:
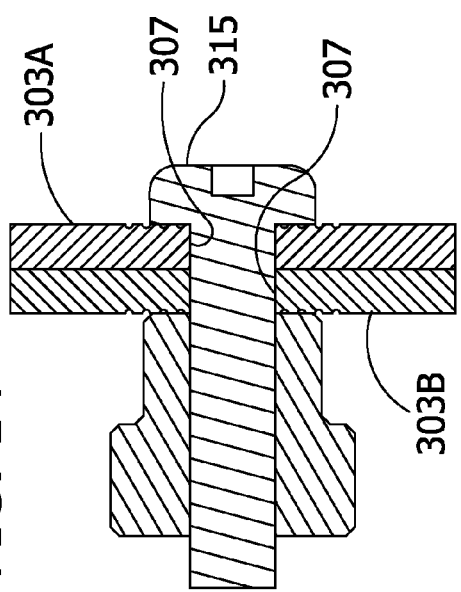
FIG. 14 is an enlarged sectional view taken on line 14-14 of FIG. 13.
Figure 15:
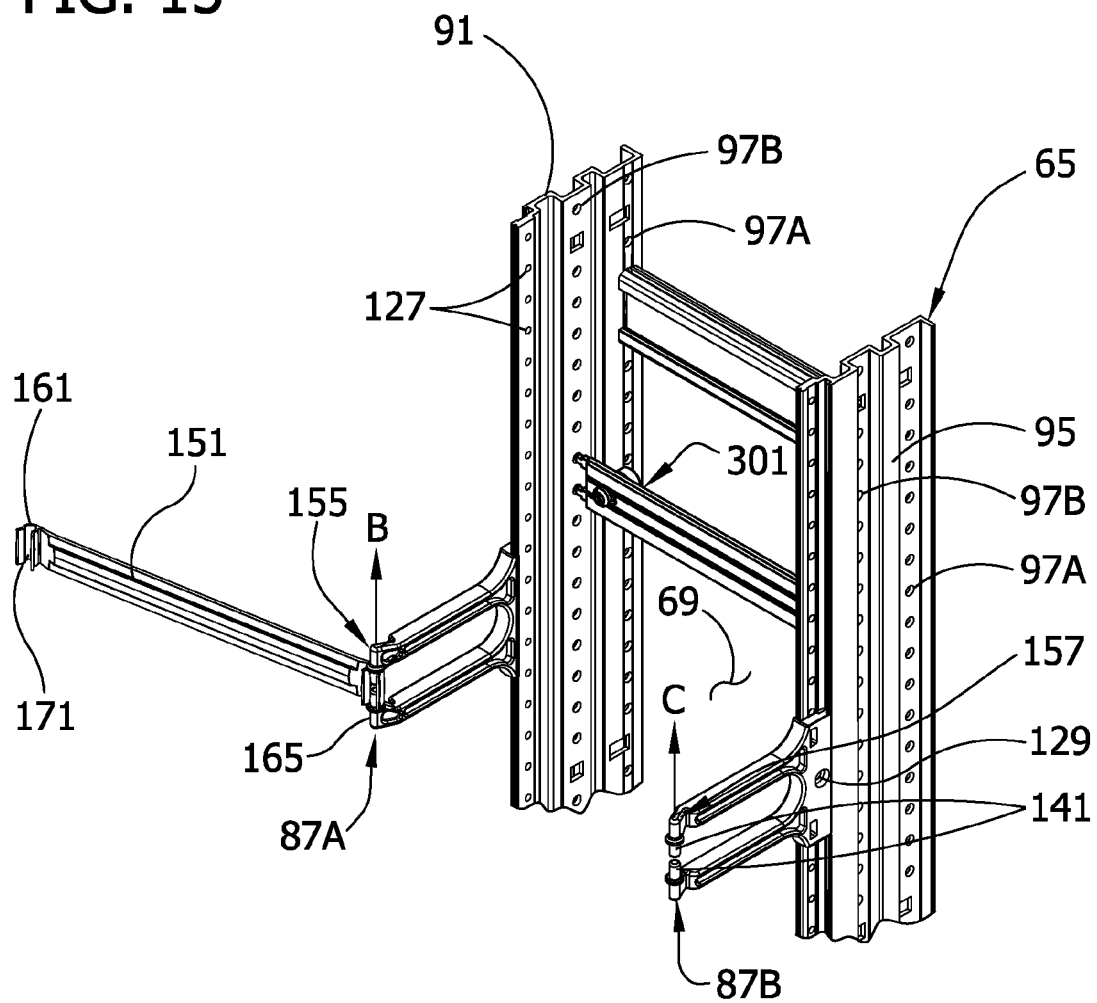
FIG. 15 is a perspective of the cable bar of FIG. 13 in a retracted position prior to being mounted in a cable manager.
Figure 16:
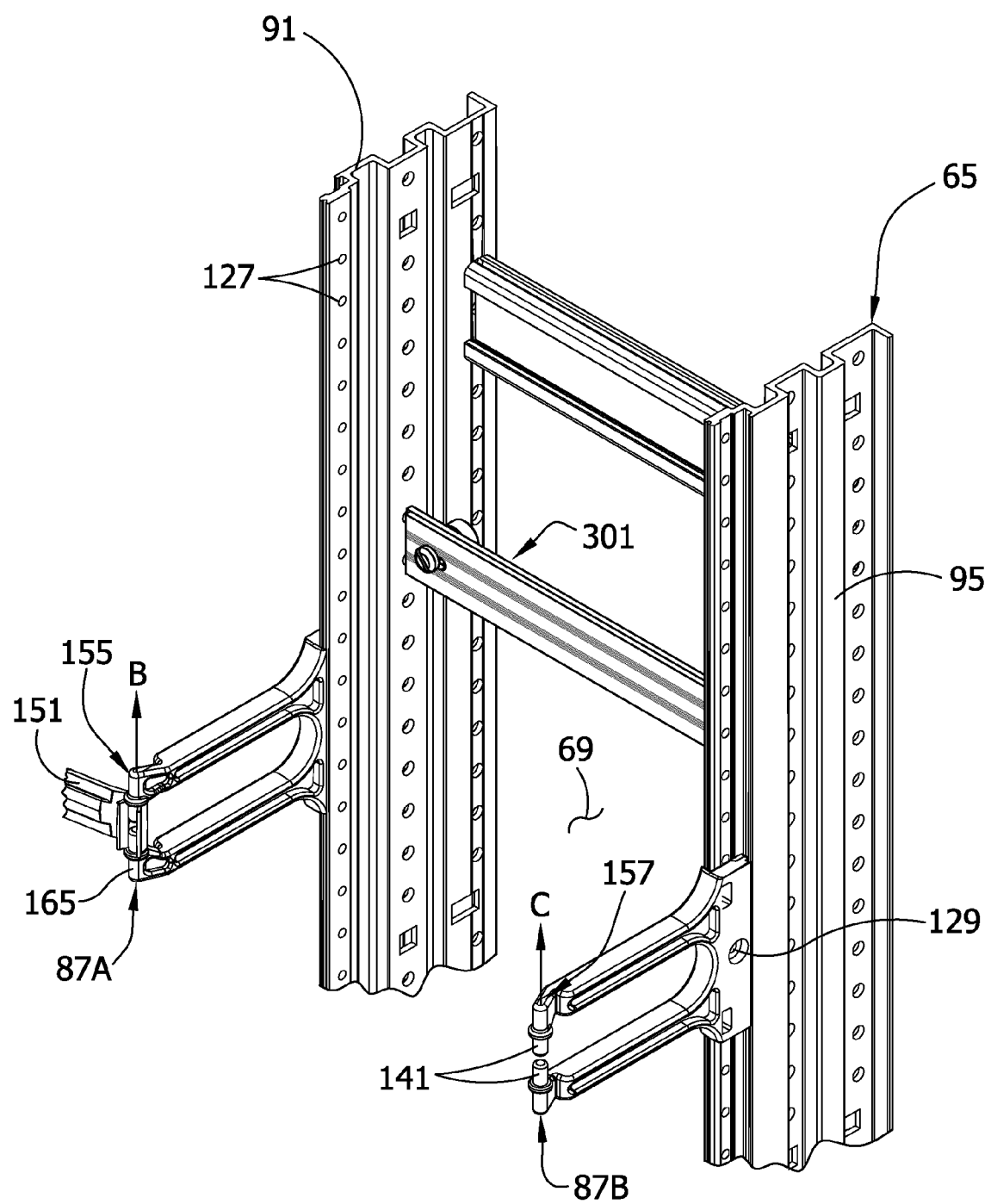
FIG. 16 is a perspective of the cable bar of FIG. 13 in an extended position in which it is mounted in a cable manager.
Figure 17:
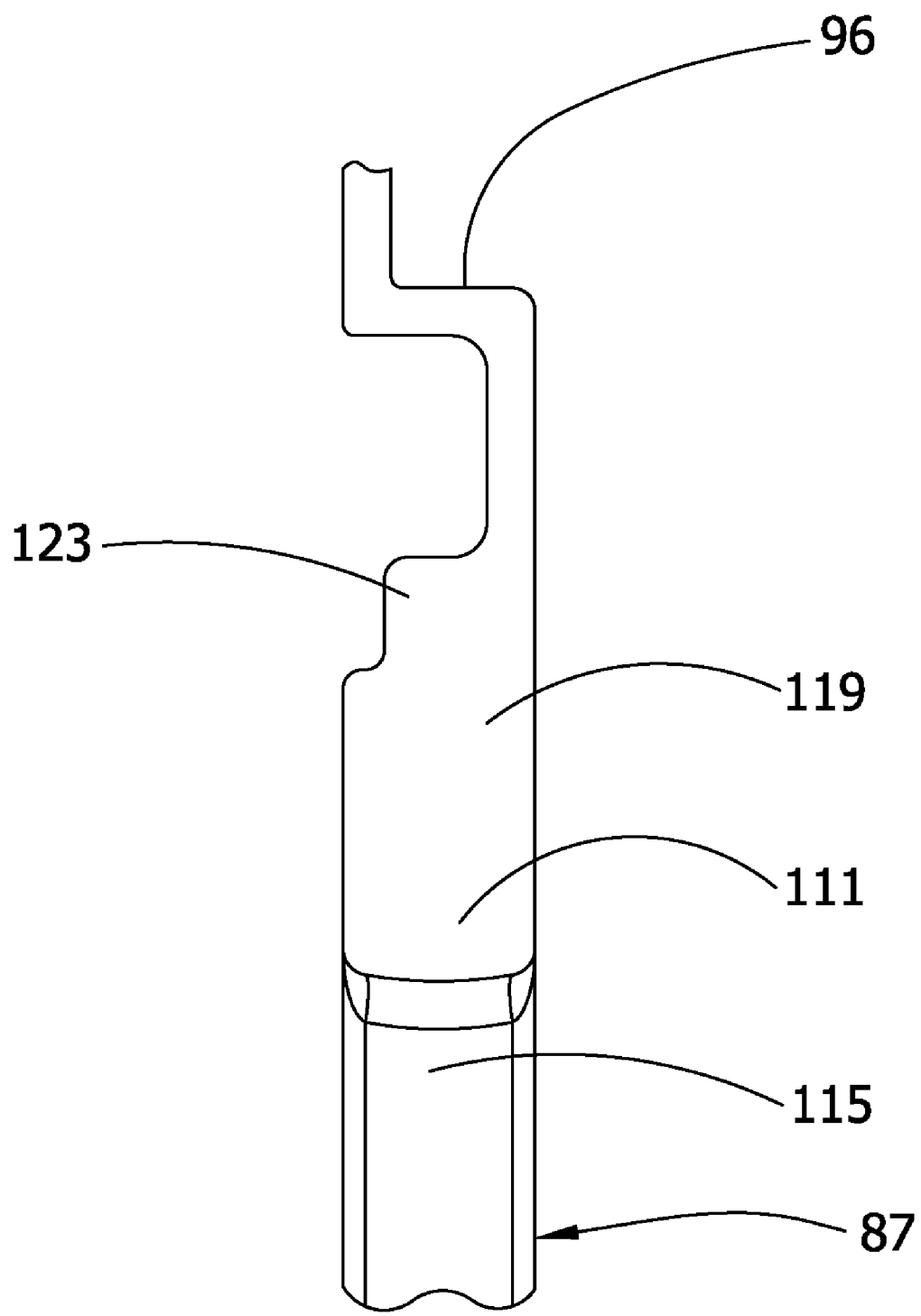
FIG. 17 is a view similar to FIG. 6A showing an embodiment where a cable guide is formed as one piece with a side wall of a cable manager.
Figure 18:
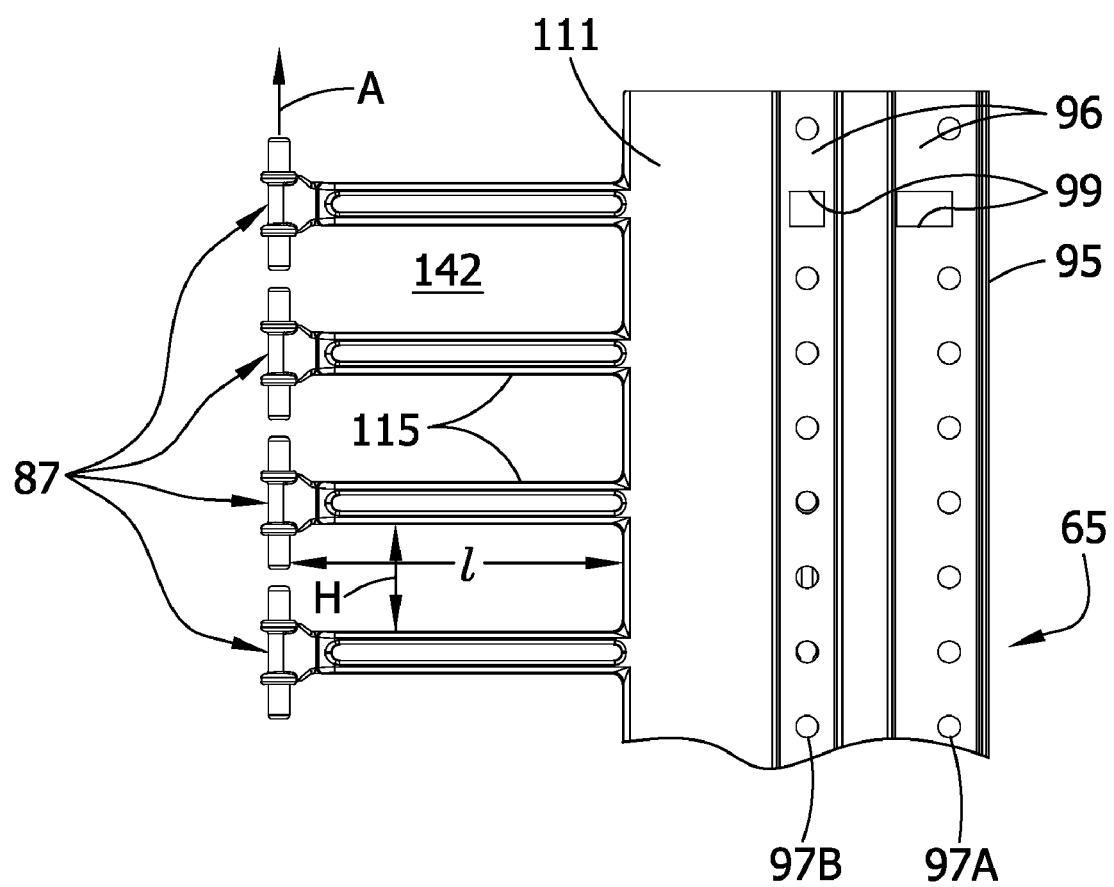
FIG. 18 is a view similar to a portion of FIG. 7 showing an embodiment where multiple cable guides are formed as one piece with a side wall of a cable manager.
Figure 19:
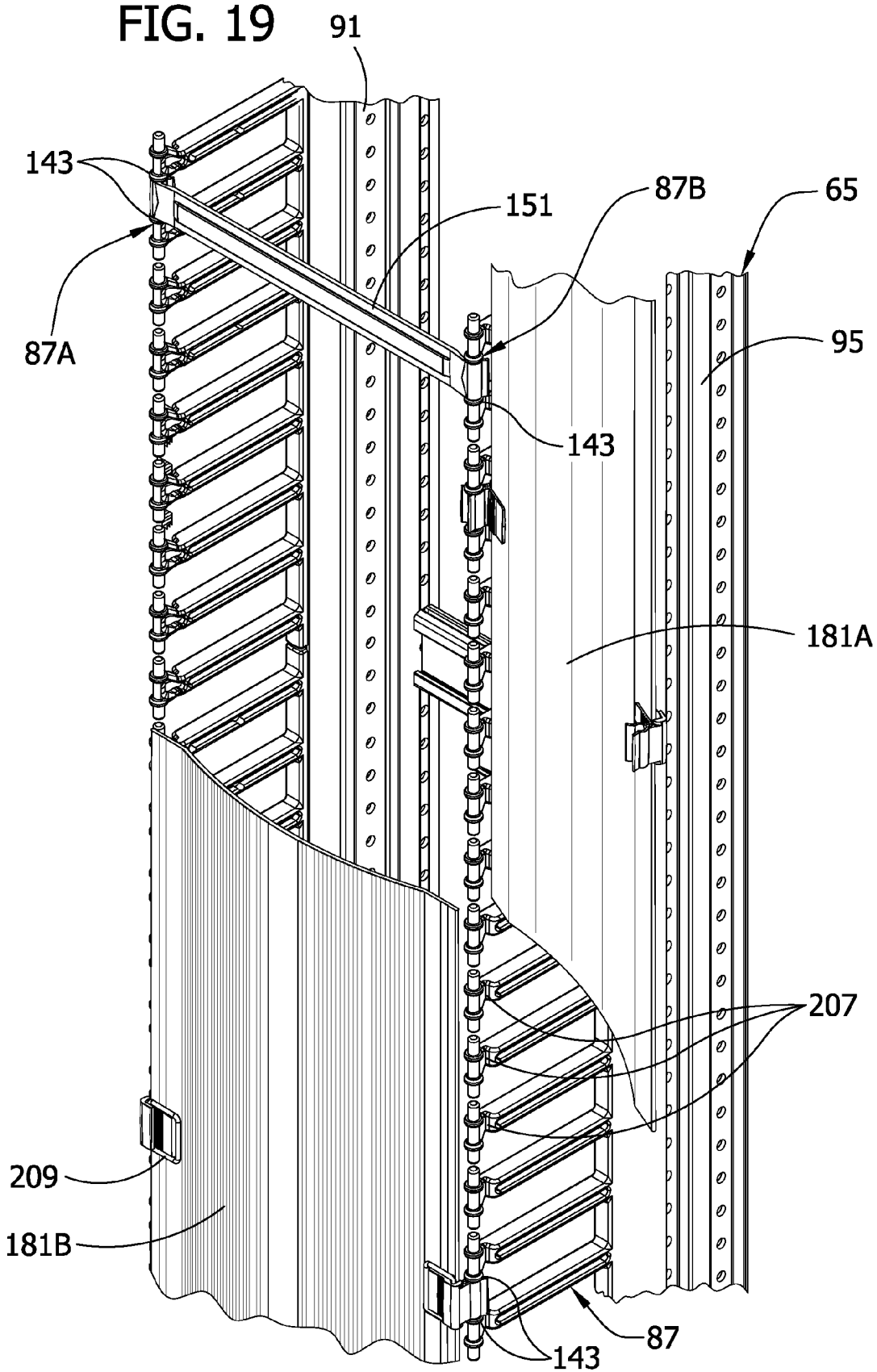
FIG. 19 is a view similar to FIG. 8 showing an embodiment where multiple cable guides are formed as one piece with each side wall of a cable manager.
Figure 20:
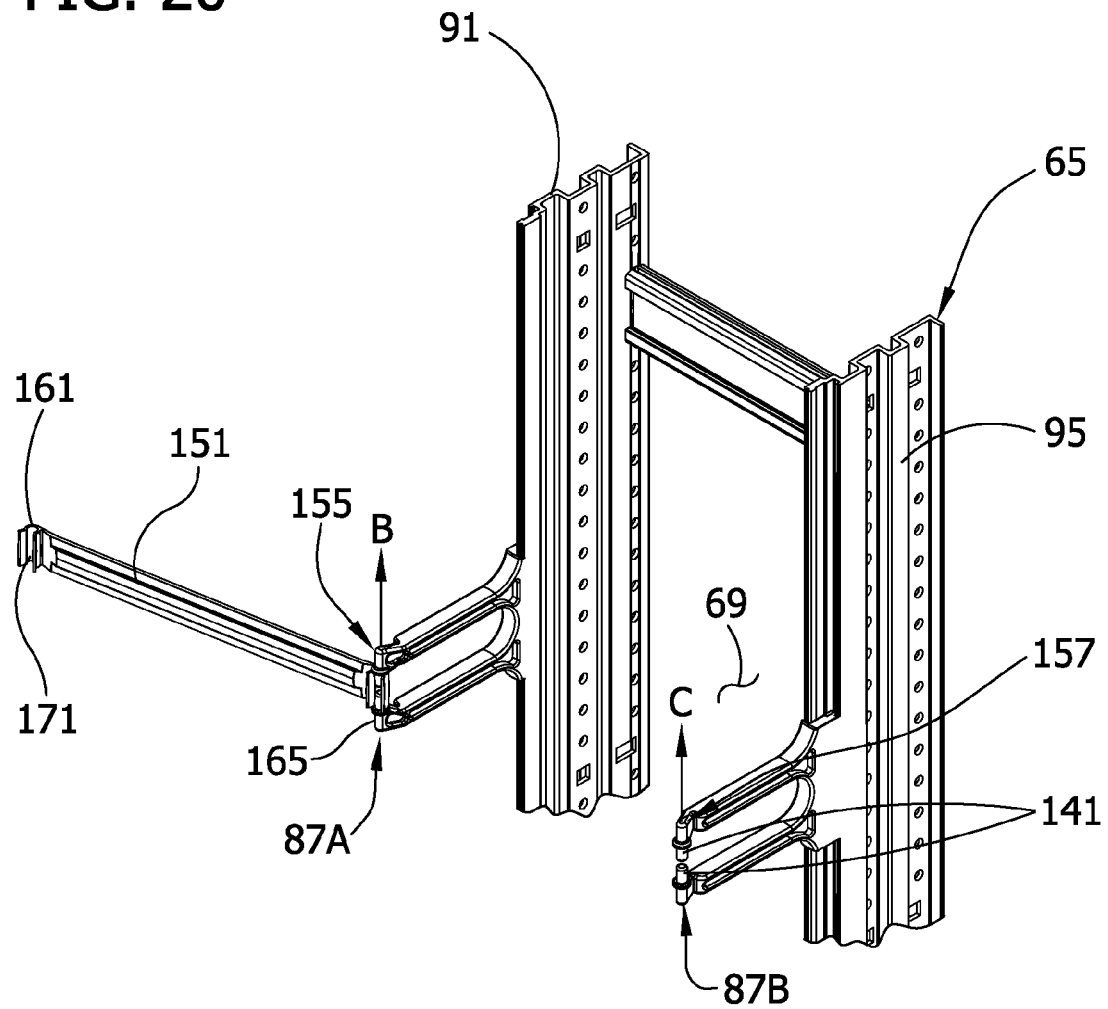
FIG. 20 is a view similar to FIG. 9 showing an embodiment where single cable guides are formed as one piece with respective side walls of a cable manager.

As would be understood by one skilled in the art, cable managers 65 may also be positioned back-to-back on one lateral side of the same rack 31. For example, as shown in FIG. 12, a third cable manager 65' is attached to an upright 39 of the rack 31 to define a third cable path 69 adjacent the right cable manager 65R. The rear side 79R of the right cable manager 65R faces a rear side 79' of the third cable manager 65'. As would be understood by one skilled in the art, additional cable managers 65 may be mounted back-to-back on either the right or left sides of the rack 31. Utilizing more than one cable manager 65 per rack 31 will also provide added capacity for high density applications. Users can also mount and remount cable guides 87 and gates 151 in the field at any selected locations, as needed.

Moreover, the cable managers 65R,65' are depicted with a variety of cable guides 87 at various locations on the side walls 91,95 to better illustrate the flexibility of the claimed invention in routing cables 25. For example, continuous cable guides 87 may be utilized where there is high cable density (e.g., a rack 31 with numerous closely-spaced patch panels), whereas single cable guides may be mounted less frequently where cable density is lower (e.g., a rack with larger equipment 29 requiguide fewer cables 25). The high density and low density cable guides 87 may be used at various locations on the same cable manager 65, thereby broadening the usage of a single cable manager for use with different types of electronic equipment 29.

The cable managers described above are illustrated in a vertical orientation, and the various hole spacings and other components are described using the terms "vertical" or "vertically" to indicate that such components extend generally lengthwise of the cable manager, i.e., generally parallel to the length of the cable manager. However, it will be understood that cable managers and components of this invention can also be used in a horizontal orientation, or even in orientations which are angled off vertical and horizontal.

The term "cable guide" as used generally in this application, including the claims, is intended to encompass not only a structure 87 as illustrated in the drawings but also any other structure which projects forward from a side wall of a cable manager and which defines an opening which lies in a plane which is generally coincident with or parallel to the side wall, and which functions to guide or route cable through such opening in a direction generally perpendicular to the main cable path defined by the cable manager, i.e, in a direction generally at rights angles to the lengthwise direction of the cable manager. Typically this direction is vertical, as shown in the drawings, but it can also be a horizontal direction where the cable manager is mounted in a generally horizontal orientation. The terms "cable guide", "cable ring" and "cable loop" are sometimes used interchangeably in the trade.

When introducing elements of this invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above constructions without departing from the scope of the invention, it is intended that all matter contained in the above description and shown in the accompanying drawings shall be interpreted as illustrative and not in a limiting sense.

What is claimed is:

1. A cable manager for routing cable with respect to electronic equipment mounted on a rack, said rack comprising a bottom frame structure and at least two uprights extending up from the bottom frame structure at left and right sides of the rack, said cable manager comprising:

left and right generally vertical, spaced apart side walls;
vertically spaced rack fastener holes in at least one of the side walls for receiving rack fasteners to fasten the cable manager to an upright of the rack at a location outboard of the rack,
a set of one or more cable guides,
vertically spaced cable guide fastener holes in the one side wall of the cable manager for mounting the one or more cable guides in a position projecting forward and generally parallel to the one side wall,
cable guide fasteners for releasably attaching the one or more cable guides to the one side wall of the cable manager via the cable guide fastener holes, and
wherein the cable guide fastener holes are vertically spaced at intervals permitting the location of the one or more cable guides to be changed after initial attachment to the at least one side wall.

2. The cable manager set forth in claim 1 wherein the cable guide fastener holes are vertically spaced at regular intervals corresponding to a fraction or whole number multiple of a vertical dimension corresponding to a standard rack mounting unit (RMU).

3. The cable manager set forth in claim 2 wherein said cable guide fastener holes are vertically spaced at regular intervals corresponding to a fraction of said vertical dimension.

4. The cable manager set forth in claim 1, wherein each cable guide comprises a base having said cable guide fastener holes therein, and two adjacent and vertically spaced cantilever arms projecting from the base in a direction generally parallel to the base.

5. The cable manager set forth in claim 4, wherein the rack fastener holes are located in one or more vertical channels in the one side wall of the cable manager.

6. The cable manager of claim 1 mounted outboard of one of the uprights of said rack to form a cable management system, the left and right uprights of the rack having equipment mounting holes therein vertically spaced at repeating intervals related to a vertical dimension of a standard rack mounting unit (RMU), and wherein the cable guide fastener holes are vertically spaced at regular intervals corresponding to a fraction or whole number multiple of said RMU vertical dimension.

7. The cable management system of claim 6, wherein the cable guide fastener holes are vertically spaced at regular intervals corresponding to a fraction of said RMU vertical dimension.

8. The cable manager set forth in claim 1 mounted outboard of one of the uprights of said rack to form a cable management system, each cable guide comprising a base having said cable guide fastener holes therein, and two adjacent, vertically spaced cantilever arms projecting from the base in a direction generally parallel to the base.

9. The cable management system of claim 8, wherein each of said cable guides comprises a base having a mounting flange mounted on said one side wall of the cable manager, and wherein the one side wall and the mounting flange have a tongue-and-groove joint for maintaining the lateral position of the mounting flange with the one side wall.

10. The cable management system of claim 8, wherein the rack fastener holes are located in one or more vertical channels in the one side wall of the cable manager, and rack fasteners extending through the rack fastener holes for fastening the cable manager to a respective upright of the rack, the rack fasteners having heads receiving in said one or more vertical channels.

* * * * *